US010504585B2

(12) United States Patent
Louie et al.

(10) Patent No.: US 10,504,585 B2
(45) Date of Patent: Dec. 10, 2019

(54) SCALABLE FLOATING BODY MEMORY CELL FOR MEMORY COMPILERS AND METHOD OF USING FLOATING BODY MEMORIES WITH MEMORY COMPILERS

(71) Applicant: Zeno Semiconductor, Inc., Sunnyvale, CA (US)

(72) Inventors: Benjamin S. Louie, Fremont, CA (US); Yuniarto Widjaja, Cupertino, CA (US); Zvi Or-Bach, San Jose, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 149 days.

(21) Appl. No.: 15/820,869

(22) Filed: Nov. 22, 2017

(65) Prior Publication Data

US 2018/0096721 A1    Apr. 5, 2018

Related U.S. Application Data

(62) Division of application No. 15/002,207, filed on Jan. 20, 2016, now Pat. No. 9,865,332, which is a division of application No. 14/250,370, filed on Apr. 10, 2014, now Pat. No. 9,275,723.

(60) Provisional application No. 61/810,433, filed on Apr. 10, 2013.

(51) Int. Cl.
| G11C 11/419 | (2006.01) |
| G11C 11/417 | (2006.01) |
| G06F 17/50  | (2006.01) |
| H01L 27/11  | (2006.01) |
| G11C 8/16   | (2006.01) |
| G11C 11/412 | (2006.01) |

(52) U.S. Cl.
CPC ........ *G11C 11/419* (2013.01); *G06F 17/5045* (2013.01); *G06F 17/5068* (2013.01); *G11C 8/16* (2013.01); *G11C 11/412* (2013.01); *G11C 11/417* (2013.01); *H01L 27/11* (2013.01)

(58) Field of Classification Search
CPC ....... G11C 11/419; G11C 11/412; G11C 8/16; G11C 11/417; G06F 17/5068; G06F 17/5045; H01L 27/11
See application file for complete search history.

(56) References Cited

U.S. PATENT DOCUMENTS

| 4,300,212 A | 11/1981 | Simko |
| 4,385,308 A | 5/1983 | Uchida |
| 4,959,812 A | 9/1990 | Momodoni et al. |
| 5,519,831 A | 5/1996 | Holzhammer |
| 5,581,504 A | 12/1996 | Chang et al. |
| 5,748,538 A | 5/1998 | Lee et al. |
| 5,767,549 A | 6/1998 | Chen et al. |

(Continued)

OTHER PUBLICATIONS

Chatterjee, et al. "Taper isolated dynamic gain RAM cell." Electron Devices Meeting, 1978 International. vol. 24. IEEE, 1978, pp. 698-699.

(Continued)

*Primary Examiner* — Nha T Nguyen
(74) *Attorney, Agent, or Firm* — Law Office of Alan W. Cannon

(57) ABSTRACT

A floating body SRAM cell that is readily scalable for selection by a memory compiler for making memory arrays is provided. A method of selecting a floating body SRAM cell by a memory compiler for use in array design is provided.

20 Claims, 11 Drawing Sheets

(56) References Cited

U.S. PATENT DOCUMENTS

| | | | |
|---|---|---|---|
| 5,999,444 A | 12/1999 | Fujiwara et al. |
| 6,005,818 A | 12/1999 | Ferrant et al. |
| 6,064,100 A | 5/2000 | Wen |
| 6,141,248 A | 10/2000 | Forbes et al. |
| 6,163,048 A | 12/2000 | Hirose et al. |
| 6,166,407 A | 12/2000 | Ohta |
| 6,243,293 B1 | 6/2001 | Van Houdt et al. |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,625,057 B2 | 9/2003 | Iwata |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,845,042 B2 | 1/2005 | Ichige et al. |
| 6,870,751 B2 | 3/2005 | van Brocklin et al. |
| 6,885,581 B2 | 4/2005 | Nemati et al. |
| 6,912,150 B2 | 6/2005 | Portman et al. |
| 6,925,006 B2 | 8/2005 | Fazan et al. |
| 6,954,377 B2 | 10/2005 | Choi et al. |
| 6,969,662 B2 | 11/2005 | Fazan et al. |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,209,384 B1 | 4/2007 | Kim |
| 7,224,019 B2 | 5/2007 | Hieda et al. |
| 7,259,420 B2 | 8/2007 | Anderson et al. |
| 7,259,992 B2 | 8/2007 | Shirota |
| 7,280,399 B2 | 10/2007 | Fazan et al. |
| 7,285,820 B2 | 10/2007 | Park et al. |
| 7,301,803 B2 | 11/2007 | Okhonin et al. |
| 7,301,838 B2 | 11/2007 | Waller et al. |
| 7,329,580 B2 | 2/2008 | Cho et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,498,630 B2 | 3/2009 | Ichige et al. |
| 7,504,302 B2 | 3/2009 | Matthew et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,933,139 B2 | 4/2011 | Lung |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,868 B2 | 4/2012 | Widjaja |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja |
| 8,243,499 B2 | 8/2012 | Widjaja |
| 8,264,875 B2 | 9/2012 | Widjaja et al. |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,817,548 B2 | 8/2014 | Widjaja et al. |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,025,358 B2 | 5/2015 | Widjaja |
| 9,029,922 B2 | 5/2015 | Han et al. |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,208,880 B2 | 12/2015 | Louie et al. |
| 9,209,188 B2 | 12/2015 | Widjaja |
| 9,230,651 B2 | 1/2016 | Widjaja et al. |
| 9,230,965 B2 | 1/2016 | Widjaja |
| 9,236,382 B2 | 1/2016 | Widjaja et al. |
| 9,257,179 B2 | 2/2016 | Widjaja |
| 9,275,723 B2 | 3/2016 | Louie et al. |
| 9,391,079 B2 | 7/2016 | Widjaja |
| 9,401,206 B2 | 7/2016 | Widjaja |
| 9,431,401 B2 | 8/2016 | Han et al. |
| 9,455,262 B2 | 9/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,514,803 B2 | 12/2016 | Widjaja |
| 9,524,970 B2 | 12/2016 | Widjaja |
| 9,576,962 B2 | 2/2017 | Widjaja et al. |
| 9,589,963 B2 | 3/2017 | Widjaja |
| 9,601,493 B2 | 3/2017 | Widjaja |
| 9,614,080 B2 | 4/2017 | Widjaja |
| 9,646,693 B2 | 5/2017 | Widjaja |
| 9,653,467 B2 | 5/2017 | Widjaja et al. |
| 9,666,275 B2 | 5/2017 | Widjaja |
| 9,679,648 B2 | 6/2017 | Widjaja |
| 9,704,870 B2 | 7/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 9,812,203 B2 | 11/2017 | Widjaja |
| 9,812,456 B2 | 11/2017 | Widjaja |
| 9,831,247 B2 | 11/2017 | Han et al. |
| 9,847,131 B2 | 12/2017 | Widjaja |
| 9,865,332 B2 | 1/2018 | Louie et al. |
| 9,893,067 B2 | 2/2018 | Widjaja et al. |
| 9,905,564 B2 | 2/2018 | Widjaja et al. |
| 2002/0018366 A1 | 2/2002 | von Schwerin et al. |
| 2002/0048193 A1 | 4/2002 | Tanikawa et al. |
| 2005/0003612 A1 | 1/2005 | Hackler et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0018164 A1 | 1/2006 | Wu |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164352 A1 | 7/2007 | Padilla |
| 2007/0210338 A1 | 9/2007 | Orlowski |
| 2007/0215954 A1 | 9/2007 | Mouli |
| 2007/0242513 A1 | 10/2007 | Chang et al. |
| 2007/0263466 A1 | 11/2007 | Morishita et al. |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0111154 A1 | 5/2008 | Voldman |

(56) References Cited

U.S. PATENT DOCUMENTS

| | | |
|---|---|---|
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0157664 A1 | 6/2010 | Chung |
| 2010/0246277 A1 | 9/2010 | Widjaja |
| 2010/0246284 A1 | 9/2010 | Widjaja |
| 2010/0290271 A1 | 11/2010 | Lung |
| 2011/0012202 A1* | 1/2011 | Chang .......... H01L 21/845 257/350 |
| 2011/0032756 A1 | 2/2011 | Widjaja |
| 2011/0042736 A1 | 2/2011 | Widjaja |
| 2011/0044110 A1 | 2/2011 | Widjaja |
| 2011/0145777 A1* | 6/2011 | Iyer .......... G06F 12/0844 716/132 |
| 2011/0170329 A1 | 7/2011 | Kang |
| 2011/0228591 A1 | 9/2011 | Widjaja |
| 2011/0228617 A1 | 9/2011 | Wang et al. |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0081976 A1 | 4/2012 | Widjaja et al. |
| 2012/0106234 A1 | 5/2012 | Widjaja |
| 2012/0113712 A1 | 5/2012 | Widjaja |
| 2012/0217549 A1 | 8/2012 | Widjaja |
| 2012/0230123 A1 | 9/2012 | Widjaja et al. |
| 2012/0241708 A1 | 9/2012 | Widjaja |
| 2012/0281475 A1 | 11/2012 | Oh et al. |
| 2013/0015517 A1 | 1/2013 | Widjaja et al. |
| 2013/0058169 A1 | 3/2013 | Lee et al. |
| 2013/0094280 A1 | 4/2013 | Widjaja |
| 2013/0229857 A1 | 9/2013 | Kajigaya |
| 2013/0250685 A1 | 9/2013 | Widjaja |
| 2013/0264656 A1 | 10/2013 | Widjaja et al. |
| 2014/0036577 A1 | 2/2014 | Widjaja |
| 2014/0159156 A1 | 6/2014 | Widjaja |
| 2014/0160868 A1 | 6/2014 | Widjaja et al. |
| 2014/0198551 A1 | 7/2014 | Louie et al. |
| 2014/0307501 A1 | 10/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0148675 A1 | 5/2016 | Louie et al. |
| 2016/0300613 A1 | 10/2016 | Widjaja |
| 2016/0300841 A1 | 10/2016 | Widjaja |
| 2016/0336326 A1 | 11/2016 | Han et al. |
| 2016/0365444 A1 | 12/2016 | Widjaja |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0092359 A1 | 3/2017 | Louie et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0365340 A1 | 12/2017 | Widjaja |
| 2017/0365607 A1 | 12/2017 | Widjaja |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0069008 A1 | 3/2018 | Han et al. |
| 2018/0075907 A1 | 3/2018 | Widjaja |

OTHER PUBLICATIONS

Chatterjee, et al. Circuit Optimization of the Paper Isolated Dynamic Gain RAM Cell for VLSI Memories, pp. 22-23, 1979.

Chatterjee, et al. "a survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Lanyon et al., "Bandgap Narrowing in Moderately to Heavily Doped Silicon", pp. 1014-1018, No. 7, vol. ED-26, 1979 IEEE.

Leiss, et al, "dRAM Design Using the Taper-Isolated Dynamic RAM Cell." Solid-State Circuits, IEEE Journal of 17.2 (1982): 337-344.

Lin et al., "A new 1T DRAM Cell with enhanced Floating Body Effect", pp. 1-5, Proceedings of the 2006 IEEE International Workshop on Memory Technology.

Ohsawa et al., "Autonomous refresh of floating body cell (FBC)", Electron Devices Meeting, 2008. IEDM 2008. IEEE International. IEEE 2008, pp. 801-804.

Oh et al., "A 4-Bit Double SONOS memory (DSM) with 4 Storage Nodes Per Cell for Ultimate Multi-Bit Operation", pp. 1-2, 2006 Symposium on VLSI Technology Digest of Technical Papers.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.

Reisch, "On bistable behavior and open-base breakdown of bipolar transistors in the avalanche regime-modeling and applications." Electron Devices, IEEE Transactions on 39.6 (1992): 1398-1409.

Sakui et al., "A new static memory cell based on reverse bias current (RBC) effect of bipolar transistor", Electron Devices Meeting, 1988. IEDM'88. Technical Digest, International IEEE, 1988, pp. 44-47.

Sakui et al., "A new static memory cell based on the reverse bias current effect of bipolar transistors", Electron Devices, IEEE Transactions on 36.6 (1989): 1215-1217.

Sze et al., "Physics of Semiconductor Devices", Wiley-Interscience, 2007, p. 104.

(56) References Cited

OTHER PUBLICATIONS

Terada et al., "A new VLSI memory cell using capacitance coupling (CC) cell", Electron Devices, IEEE Transactions on 31.9 (1984); pp. 1319-1324.
Villaret et al., "Further insight into the physics and modeling of floating-body capacitorless DRAMs", Electron Devices, IEEE Transactions on 52.11 (2005); pp. 2447-2454.
Ohsawa et al., "Autonomous refresh of floating-body cell due to Current Anomaly of Impact Ionization", vol. 56, No. 10, pp. 2301-2311, 2009.
Ban et al., "A Scaled Floating Body Cell (FBC) memory with High-k+Metal Gate on Thin-Silicon and Thin-BOX fro 16-nm Technology Node and Beyond", Symposium on VLSI Technology, 2008, pp. 92-93.
Campardo et al., VLSI Design of Non-Volatile Memories, Springer-Berlin Heidelberg New York, 2005, pp. 94-95.
Han et al., "Programming/Erasing Characteristics of 45 nm NOR-Type Flash Memory Based on SOI Fin FET Structure", J. Korean Physical Society, vol. 47, Nov. 2005, pp. S564-S567.
Headland, Hot electron injection, Feb. 19, 2004.
Pellizer et al., "A 90 nm Phase Change Memory Technology for Stand-Alone Non-Volatile Memory Applications", Symposium on VLSI Technology Digest of Technical Papers, IEEE, 2006, pp. 1-2.
Pierret, Semiconductor Device Fundamentals, ISBN: 0-201-54393-1, 1996, Addison-Wesley Publishing Company, Inc., PNPN Devices 463-476.
Tack et al., "The Multistable Charge-Controlled Memory Effect in SOI Transistors at Low Temperatures", IEEE Transactions on Electron Devices, vol. 37, May 1990, pp. 1373-1382.
Okhonin et al., "A SOI Capacitor-less 1T DRAM Concept", 2001 IEEE International SOI Conference, pp. 153-154.
Ohsawa et al., "An 18.5ns 128Mb SOI DRAM with a Floating Body Cell", IEEE International Solid-State Circuits Conference, 2005, pp. 458-459 and 609.
Okhonin et al., "Principles of Transient Charge Pumping on Partially Depleted SOI MOSFETs", IEEE Electron Device Letters, vol. 23, No. 5, May 2002, pp. 279-281.
Okhonin et al., "A Capacitor-less 1T DRAM Cell", IEEE Electron device Letters, vol. 23, No. 2, Feb. 2002, pp. 85-87.
Ohsawa et al., "Memory Design using One-Transistor Gain Cell on SOI", Tech. Digest, IEEE Internataional Solid-State Circuits, vol. 37, No. 11, 2002, pp. 1510-1522.
Yoshida et al., "A Design of a Capacitorless 1T-DRAM Cell Using Gate-Induced Drain Leakage (GIDL) Current for Low-power and High-speed Embedded Memory", International Electron Devices Meeting, 2003, pp. 1-4.
Bawedin et al., "Floating-Body SOI Memory: Concepts, Physics and Challenges", ECS Transactions 19.4 (2009) pp. 243-256.
Ban et al., "Integration of Back-Gate doping for 15-nm node floating body cell (FBC) memory", VLSI Technology (VLSIT), 2010 Symposium on IEEE, 2010, pp. 159-160.
Chiu et al., "Characteristics of a new trench-oxide thin film transistor and its 1T-DRAM applications", Solid-State and Integrated Circuit Technology (ICSICT), 2010 10th IEEE International Conference on IEEE, 2010, pp. 1106-1108.
Chiu et al., "A simple process of thin-film transistor using the trench-oxide layer for improving 1T-DRAM performance", Next Generation Electronics (ISNE), 2010 International Symposium on IEEE, 2010, pp. 254-257.
Chun et al., "A 1.1 V, 667 MHz random cycle, asymmetric 2T gain cell embedded DRAM with a 99.9 percentile retention time of 110 microsec", VLSI Circuits (VLSIC), 2010 IEEE Symposium on, IEEE, 2010, pp. 191-192.
Collaert et al., "A low voltage biasing scheme for aggressively scaled bulk FinFET 1T-DRAM featuring 10s retention at 85 C", VLSI Technology (VLSIT), 2010 Symposium on. IEEE, 2010, pp. 161-162.
Giusi et al., "Bipolar mode operation and scalability of double-gate capacitorless 1T-DRAM cells", Electron Devices, IEEE Transactions on, vol. 57, No. 8 (2010), pp. 1743-1750.
Gupta et al., "32nm high-density, high-speed T-RAM embedded memory technology", Electron Devices Meeting (IEDM), 2010 IEEE International, IEEE, 2010, pp. 12.1.1-12.1.4.
Han et al., "Bistable resistor (biristor)-gateless silicon nanowire memory", VLSI Technology (VLSIT), 2010 Symposium on. IEEE, 2010, pp. 171-172.
Han et al., "Biristor-bistable resistor based on a silicon nanowire", Electron Device Letters, IEEE 31.8 (2010), pp. 797-799.
Hubert et al., "Experimental comparison of programming mechanisms in 1T-DRAM cells with variable channel length", Solid-State Device Research Conference (ESSDERC), 2010 Proceedings of the European., pp. 150-153, Sep. 14-16, 2010.
Kim et al., "Vertical double gate Z-RAM technology with remarkable low voltage operation for DRAM application", VLSI Technology (VLSIT), 2010 Symposium on . . . , 2010, pp. 163-164.
Kim et al., "Silicon on replacement insulator (SRI) floating body cell (FBC) memory", VLSI Technology (VLSIT), 2010 Symposium on . . . , IEEE, 2010, pp. 165-166.
Kim et al., "Investigation of 1T DRAM cell with non-overlap structure and recessed channel", Silicon Nanoelectronics Workshop (SNW), 2010, IEEE, 2010, pp. 1-2.
Lu et al., "A simplified superior floating-body/gate DRAM cell", IEEE Elec. Dev. Letters, vol. 30, No. 3, Mar. 2009, pp. 282-284.
Moon et al., "fin-width dependance of BJT-based 1T-DRAM implemented on FinFET", Electron Device Letters, vol. 31, No. 9 (2010), pp. 909-911.
Moon et al., "An optically assisted program method for capacitor-less 1T-DRAM", Electron Devices, IEEE Transactions on . . . , vol. 57, No. 7, 2010, pp. 1714-1718.
Moon et al., "Ultimately scaled 20nm unified-RAM", Electron Devices Meeting (IEDM), 2010 IEEE International, IEEE, 2010, pp. 12.2.1-12.2.4.
Pulcani et al., "Simulation of intrinsic bipolar transistor mechanisms for future capacitor-less eDRAM on bulk substrate", Electronics, Circuits and Systems (ICECS), 2010 17th IEEE International Conference on . . . , IEEE, 2010, pp. 966-969.
Rodriguez et al., "A-RAM memory cell: concept and operation", Electron Device Letters, IEEE, vol. 31, No. 9 (2010), pp. 972-974.
Rodriguez et al., "A-RAM Novel capacitor-less DRAM memory", Intl SOI Conference, 2009 IEEE International . . . , pp. 1-2, IEEE, 2009.
Zhang et al., "Total ionizing Dose Effects on FinFET-Based Capacitor-less 1T-DRAMs", Nuclear Science, IEEE Trnasactions on . . . , vol. 57, No. 6, 2010, pp. 3298-3304.
Villaret et al., "Mechanisms of charge modulation in the floating body of triple-well nMOSFET capacitor-less DRAMs", Microelectronic Engineering 72 (2004) 434-439.
Almeida et al., "Comparison between low and high read bias in FB-RAM on UTBOX FDSOI devices", IEEE, 1978-1-4673-0192-3/12, 2012, pp. 61-64.
Andrade et al., "The impact of Back Bias on the Floating Body Effect in UTBOX SOI Devices for 1T-FBRAM Memory Applications", 2012 8th International Caribbean Conferences on Devices, Circuits and Systems (ICCDCS), IEEE, 2012,, 978-1-4577-1117-6/12/$26.00.
Aoulaiche et al., "Hot Hole Induced Damage in 1T-FBRAM on Bulk FinFET", 978-1-4244-911-7/11/$26.00. IEEE, 2011, pp. 2D.3.1-2D.3.6.
Aoulaiche et al., "Junction Field Effect on the Retention Time for One-Transistor Floating-Body RAM", IEEE Transactions on Electron Devices, vol. 59, No. 8, Aug. 2012, pp. 2167-2172.
Avci et al., "Floating-Body Diode—A Novel DRAM Device", IEEE Electron Device Letters, vol. 33, No. 2, Feb. 2012, pp. 161-163.
Cao et al., "A Novel 1T-DRAM Cell for Embedded Application", IEEE Transactions on Electron Devices, vol. 59, No. 5, May 2012, pp. 1304-1310.
Cho et al., "Variation-Aware Study of BJT-based Capacitorless DRAM Cell Scaling Limit", Silicon Nanoelectronics Workshop (SNW), 2012 IEEE; 978-1-4673-0996-7.
Cho et al., "Variation Study and Implications for BJT-BasedThin-Body Capacitorless DRAM", IEEE Electron Device Letters, vol. 33, No. 3, Mar. 2012, pp. 312-314.

(56) References Cited

OTHER PUBLICATIONS

Chun et al., "A 667 MHz Logic-Compatible Embedded DRAM Featuring an Asymmetric 2T Gain Cell for High Speed On-Die Caches", IEEE Journal of Solid-State Circuits, vol. 47, No. 2, Feb. 2012, pp. 547-559.
Collaert et al., "Substrate bias dependency of sense margin and retention in bulk FinFET 1T-DRAM cells", Solid-State Electronics 65-66 (2011) 205-210.
Galeti et al., "BJT effect analysis in p- and n-SOI MuGFETs with high-k gate dielectrics and TiN metal gate electrode for a 1T-DRAM application", 978-1-61284-760-3/11/$26.00 © 2011 IEEE.
Gamiz et al., "3D Trigate 1T-DRAM memory cell for 2x nm nodes", 978-1-4673-1081-9/12/$31.00 © 2012 IEEE.
Gamiz et al., "A 20nm Low-Power Triple-Gate Multibody 1T-DRAM cell", 978-1-4577-2084-0/12/$26.00 © 2012 IEEE.
Hwang et al., "Offset Buried Metal Gate Vertical Floating Body Memory Technology with Excellent Retention Time for DRAM Application", 2011 Symposium on VLSI Technology Digest of Technical Papers, pp. 172-173.
Kim et al., "Optical Charge-Pumping: A Universal Trap Characterization Technique for Nanoscale Floating Body Devices", 2011 Symposium on VLSI Technology Digest of Technical Papers, pp. 190-191.
Lee et al., "A Novel Capacitorless 1T DRAM Cell for Data Retention Time Improvement", IEEE Transactions on Nanotechnology, vol. 10, No. 3, May 2011; pp. 462-466.
Liu et al., "A three-dimensional DRAM using floating body cell in FDSOI devices", 978-1-4673-1188-5/12/$31.00 © 2012 IEEE.
Lu et al., "A Floating-Body/Gate DRAM Cell Upgraded for Long Retention Time", IEEE Electron Device Letters, vol. 32, No. 6, Jun. 2011, pp. 731-733.
Mahatme et al., "Total Ionizing Dose Effects on Ultra Thin Buried Oxide Floating Body Memories", 978-1-4577-1680-5/12/$26.00 © 2012 IEEE; pp. MY.3.1-MY.3.5.
Moon et al., "Multi-Functional Universal Device using a Band-Engineered Vertical Structure", 978-1-4577-0505-2/11/$26.00 © 2011 IEEE, pp. 24.6.1-24.6.4.
Nicoletti et al., "The Dependence of Retention Time on Gate Length in UTBOX FBRAM With Different Source/Drain Junction Engineering", IEEE Electron Device Letters, vol. 33, No. 7, Jul. 2012, pp. 940-942.
Rodriguez et al., "Novel Capacitorless 1T-DRAM Cell for 22-nm Node Compatible With Bulk and SOI Substrates", IEEE Transactions on Electron Devices, vol. 58, No. 8, Aug. 2011, pp. 2371-2377.
Romanjek et al., "Compact (Wg/Lg)=80/85 nm FDSOI 1T-DRAM programmed by Meta Stable Dip", 978-1-4673-0192-3/12/$31.00 © 2012 IEEE, pp. 199-202.
Rothemund et al., "The importance of being modular", 584 | Nature | vol. 485 | May 31, 2012, pp. 584-585.
Shim et al., "A BJT-Based Heterostructure 1T-DRAM for Low-Voltage Operation", IEEE Electron Device Letters, vol. 33, No. 1, Jan. 2012, pp. 14-16.
Shin et al., "A Novel Double HBT-Based Capacitorless 1T DRAM Cell With Si/SiGe Heterojunctions", IEEE Electron Device Letters, vol. 32, No. 7, Jul. 2011, pp. 850-852.
Shin et al., "Vertical-Gate Si/SiGe Double-HBT-Based Capacitorless 1T DRAM Cell for Extended Retention Time at Low Latch Voltage", IEEE Electron Device Letters, vol. 33, No. 2, Feb. 2012, pp. 134-136.
Ventrice et al., "Analytical model of deeply-scaled thyristors for memory applications", Microelectronics and Electron Devices (WMED), 2012 IEEE Workshop on, 978-1-4577-1735-2, pp. 1-4.
Wu et al., "Experimental Demonstration of the High-Performance Floating-Body/Gate DRAM Cell for Embedded Memories", IEEE Electron Device Letters, vol. 33, No. 6, Jun. 2012, pp. 743-745.
Pelizzer et al., "A 90nm Phase Change Memory Technology for Stand-Alone Non-Volatile Memory Applications", 2006 Symposium on VLSI Technology Digest of Technical Papers, 1-4244-0005-8/06/$20.00 (c) 2006 IEEE.

* cited by examiner

SCALABLE FLOATING BODY MEMORY CELL FOR MEMORY COMPILERS AND METHOD OF USING FLOATING BODY MEMORIES WITH MEMORY COMPILERS

CROSS-REFERENCE

This application is a division of co-pending application Ser. No. 15/002,207, filed on Dec. 20, 2016, which is a division of application Ser. No. 14/250,370, filed on Apr. 10, 2014, now U.S. Pat. No. 9,275,723, which claims the benefit of U.S. Provisional Application No. 61/810,433 filed Apr. 10, 2013, which applications and patent are hereby incorporated herein, in their entireties, by reference thereto and to which applications we claim priority to, under 35 U.S.C. Section 120 and 35 U.S.C. Section 119, respectively.

FIELD OF THE INVENTION

The present invention relates to semiconductor memory technology. More specifically, the invention relates to a semiconductor device utilizing an electrically floating body transistor and its usage within a memory compiler.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "dRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), each of which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, all of which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 $17^{th}$ IEEE International Conference on Electronics, Circuits, and Systems (ICECS) ("Pulicani"), all of which are hereby incorporated herein, in their entireties, by reference thereto).

Widjaja and Or-Bach describes a bi-stable SRAM cell incorporating a floating body transistor, where more than one stable state exists for each memory cell (for example as described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto). This is bi-stability is achieved due to the applied back bias which causes impact ionization and generates holes to compensate for the charge leakage current and recombination.

For memory cells to be used in a compiler, the memory cell itself must be a repeatable and robust design which can be made modular and easily scalable to allow the compiler the flexibility to freely adjust the memory array size without complicated scenarios appearing which require complicated solutions to implement.

SUMMARY OF THE INVENTION

In one aspect of the present invention, a floating body SRAM cell that is readily scalable for selection by a memory compiler for making memory arrays is provided, the cell comprising: a floating body memory cell comprising: a floating body region configured to be charged to a level indicative of a state of the memory cell, said floating body region having a first conductivity type selected from p-type and n-type conductivity types; a first region in electrical contact with the floating body region; the first region having a second conductivity type selected from the p-type and n-type conductivity types, the second conductivity type being different from the first conductivity type; a second region in electrical contact with the floating body region and spaced apart from the first region, the second region having the first conductivity type; a second transistor connected to the second region of the floating body memory cell; and a third transistor connected to the second transistor.

In at least one embodiment, the floating body memory cell further includes a third region in electrical contact with the floating body region and spaced apart from the first and second regions, the third region having the first conductivity type.

In at least one embodiment, the second region has multiple contacts electrically connected thereto.

In at least one embodiment, the floating body memory cell further includes a gate positioned between the first and second regions.

In at least one embodiment, the floating body SRAM cell further includes a first gate positioned between the first and second regions and a second gate positioned between the first and third regions.

In at least one embodiment, the second transistor functions as a pull down device and the second transistor is gated by the third transistor.

In at least one embodiment, the floating body memory cell further includes: a third region in electrical contact with the floating body region and spaced apart from the first and second regions, the third region having the first conductivity type; and a fourth transistor electrically connected to the third region.

In at least one embodiment, the floating body SRAM cell further includes a fourth transistor electrically connected to the third region.

In at least one embodiment, the second transistor functions as a pull down device and the second transistor is gated by the third transistor; and a write access transistor is connected to the third region.

In at least one embodiment, the first region is grounded.

In at least one embodiment, the cell is used as a dual port cell.

In another aspect of the present invention, a floating body SRAM cell that is readily scalable for selection by a memory compiler for making memory arrays is provided, the cell including: a floating body memory cell comprising: a floating body region configured to be charged to a level indicative of a state of the memory cell, the floating body region having a first conductivity type selected from p-type and n-type conductivity types; a first region in electrical contact with the floating body region; the first region having a second conductivity type selected from the p-type and n-type conductivity types, the second conductivity type being different from the first conductivity type; and a second region in electrical contact with the floating body region and spaced apart from the first region, the second region having the first conductivity type; a pull down device having a gate electrically connected to the second region; and a select device electrically connected to the pull down device, the select device being configured to be connected to a read bit line.

In at least one embodiment, the select device is connected to the read bit line and the read bit line is pre-charged such that a state of the floating body region can be read according to whether the read bit line is pulled down when the select device is enabled; wherein if the state of the floating body region is "1", the pull down device is turned on and when the select device is enabled, the read bit line is pulled down.

In at least one embodiment, the first region is electrically connected to a write bit line, and the floating body memory cell includes a gate positioned between the first and second regions; wherein a write operation to the floating body region is performable through the write bit line in conjunction with a predetermined bias on the gate.

In at least one embodiment, the read bit line has an output of either zero volts or a pre-charged voltage level, depending upon whether the floating body region is in state "1" or state "0".

In at least one embodiment, the first region is grounded and the SRAM cell further includes a write device connecting a write word line to the second region, wherein pure logic levels are used to read from and write to the floating body region, and enablement of the write device overpowers the floating body region to write to the floating body region.

In at least one embodiment, the floating body SRAM cell further includes: a write bit line electrically connected to the write device; the write bit line being separate and independently operable of the read bit line to allow for dual port functionality.

In at least one embodiment, the floating body SRAM cell further includes a write access transistor connected between a write bit line and the first region.

In another aspect of the present invention, a method of selecting a floating body SRAM cell by a memory compiler for use in array design is provided, the method including: a user inputting preferred design criteria to at least one processor of the memory compiler; the memory compiler evaluating the preferred design criteria by executing at least one algorithm configured to select a preferred floating body SRAM cell based on the design criteria inputs received; determining whether a preferred floating body SRAM cell can be identified based upon the preferred design criteria inputted and the at least one algorithm executed; and selecting the preferred floating body SRAM cell when identifiable, providing the user with an array design requested by the user, wherein the array design employs the preferred floating body SRAM cells; and when a preferred floating body SRAM cell cannot be clearly identified, proving the user with a report identifying floating body SRAM cell types that were eliminated base on the preferred design criteria, proving remaining SRAM cell type choices that were not eliminated and indicating which are preferable for selection; and requesting the user to adjust the preferred design criteria or provide an override so as to manually select a preferred floating body SRAM cell type.

In at least one embodiment, the floating body SRAM cell types from which the preferred floating body SRAM cell type is selected include: one-transistor floating body SRAM cell, two-transistor floating body SRAM cell, three-transistor floating body SRAM cell, four-transistor floating body SRAM cell, dual-port floating body SRAM cell and pseudo dual port floating body SRAM cell.

According to an aspect of the present invention a floating body memory cell designed for use in conjunction with a memory compiler is described. Also described are methods, criteria and algorithms to utilize floating body memory cells within a memory compiler.

These and other features of the invention will become apparent to those persons skilled in the art upon reading the details of the memory cells, arrays, methods and compilers as more fully described below.

DETAILED DESCRIPTION OF THE INVENTION

Figure 1:
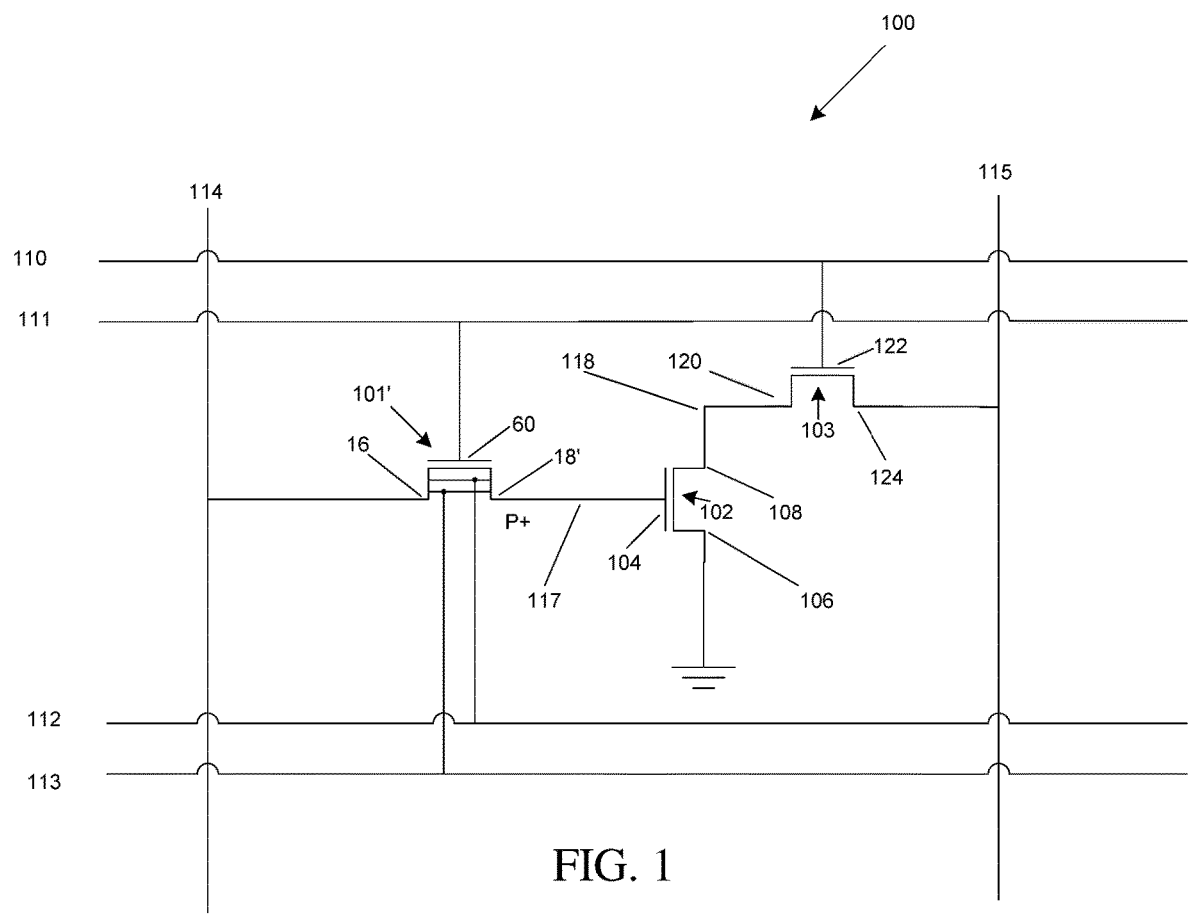
FIG. 1 is a schematic of a three transistor scalable floating body SRAM cell according to an embodiment of the present invention.

Before the present memory cells, arrays, compiler and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the array" includes reference to one or more arrays and/or sub-arrays and equivalents thereof known to those skilled in the art, and so forth.

The publications discussed herein are provided solely for their disclosure prior to the filing date of the present application. Nothing herein is to be construed as an admission that the present invention is not entitled to antedate such publication, as the dates of publication provided may be different from the actual publication dates which may need to be independently confirmed.

Definitions

The term "threshold voltage" or "Vt", as used herein, refers to the minimum voltage level required to be applied to the gate of a floating body memory cell in order to turn on the floating body memory cell to allow conduction between the source and drain of the floating body memory cell.

The term "compiler" "memory compiler", as used herein, refers to a program (and/or computer that executes the program) that takes a source code or set of constraints and creates a memory array design and physical layout comprising a plurality of memory cells based on the source code or constraints. These generated memory arrays can then be used in various application-specific integrated circuits (ASIC) designs and/or full custom designs as seen fit by the user. Memory compilers can be written to utilize a variety of memory technologies such as metal programmable read-only memory (ROM), anti-fuse ROM, static random-access memory (SRAM), erasable, programmable read-only memory (EPROM), Flash memory, etc. Some memory compilers have the ability to freely switch between multiple memory technologies based on the criteria provided.

"Pure logic levels" are voltage levels which are consistent with the supply voltages used within the logic gates and circuits throughout the rest of the device or macro. Typical examples of these voltages would be supplies like Vdd and Gnd. These voltages may be supplied by the end user or generated by some other circuit like a voltage regulator.

DETAILED DESCRIPTION

A memory compiler receives criteria or source code inputted to it and executes one or more algorithms to generate a variety of outputs such as, but not limited to, memory array circuit design, memory array layout, memory array timing model, memory array functional model, timing specifications, and memory array symbol.

The array outputs generated by memory compilers are typically customizable to an extent. The memory array sizes, including page/word size, are usually available as customizable criteria. Timing/performance is also usually a customizable parameter/criterion, which will directly affect layout size depending on the required performance Tradeoffs between array periphery size and performance are made based on the criteria provided from the user.

For memory cells to be used in a memory compiler, the memory cell itself must be a repeatable and robust design which can be made modular and easily scalable to allow the memory compiler the flexibility to freely adjust the memory array size without complicated scenarios appearing which require complicated solutions to implement.

The present invention provides scalable memory cells based on the use of floating body mechanics. The scalable floating body memories behave similarly to SRAM and are statically stable with two stable states (state 0 and state 1). Also provided are criteria which a compiler can utilize to optimize and select a preferred or ideal floating body technology to be used in a memory design. FIG. 1 is a schematic of a multi-transistor, scalable floating body SRAM cell 100, according to an embodiment of the present invention, which can be used in a compiler. The floating body memory cell (FBMC) is indicated by device 101'. This specific FBMC 101' has a P+ and N+ terminal for the source/drain connections and is shown in FIG. 1B. The P+ terminal 18' of FMBC 101' is connected to the gate 104 of NMOS (n-channel MOSFET (metal-oxide-semiconductor field-effect transistor)) device 102 via line 117. The N+ terminal 16 of device 101' is connected to the write bit line 114 which is shared among other identical memory cells (FMBC's) 101' within the same column. The gate 60 of device 101' is connected to a write word line 111. Device 102 has its source 106 connected to ground and its drain 108 connected to the source 120 of access NMOS transistor 103 via line 118. Device 103 has its gate 122 connected to a read word line 110 which would be shared with other memory cells along the same row. The drain 124 of access device 103 is connected to a read bit line 115 which is shared with other cells 101 along the same column. Line 112 is connection to the DNWELL or buried layer 22 of FBMC 101' and is shared among all cells 101 within a row, column or array. For the purposes of this invention the voltage level of line 112 is positive, preferably about 1.8V to ensure the proper operation of the FBMCs 101, although the present invention is not limited to a voltage level of 1.8V, as other preset positive voltages may alternatively be applied. Terminal 113 is the substrate terminal that connects to the substrate 12 of cells 101. This terminal will be considered to be consistently at ground for the purposes of this invention unless otherwise stated.

Figure 1A:
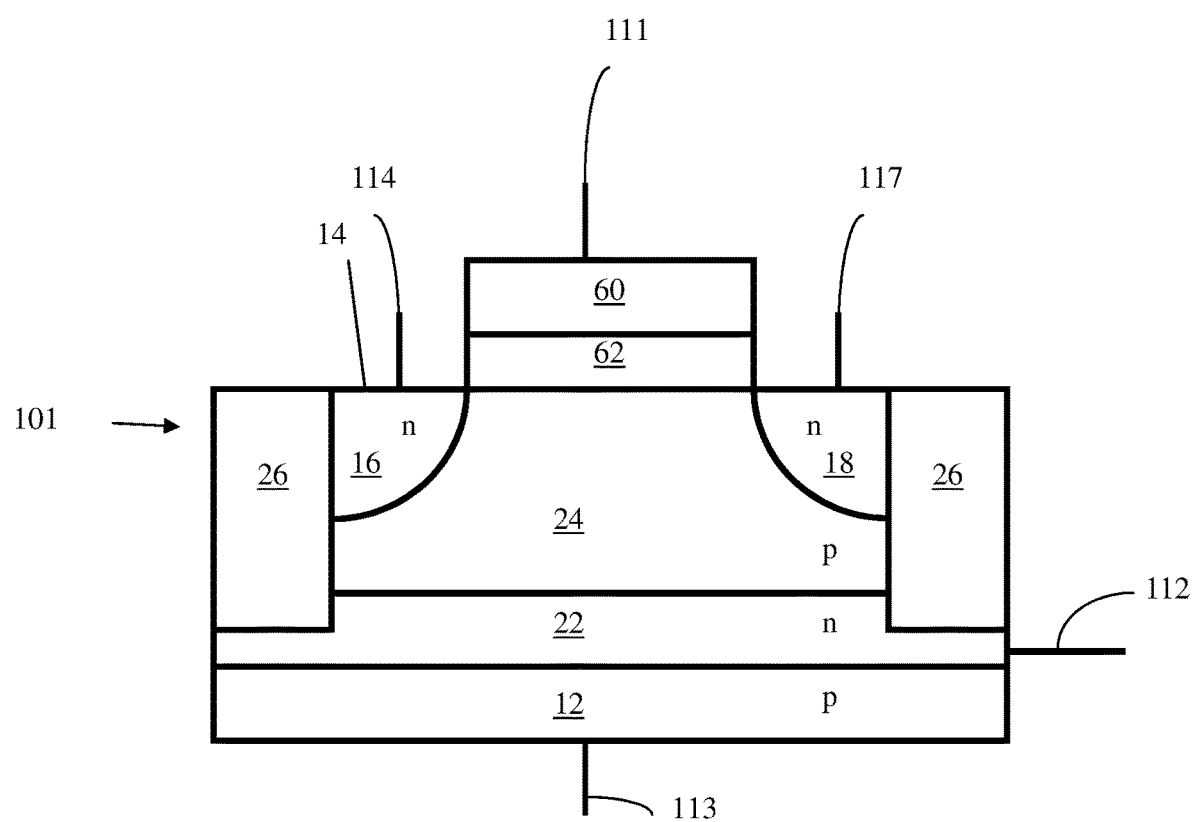
FIG. 1A is a cross section of a known floating body memory cell, according to the prior art.
Figure 1B:
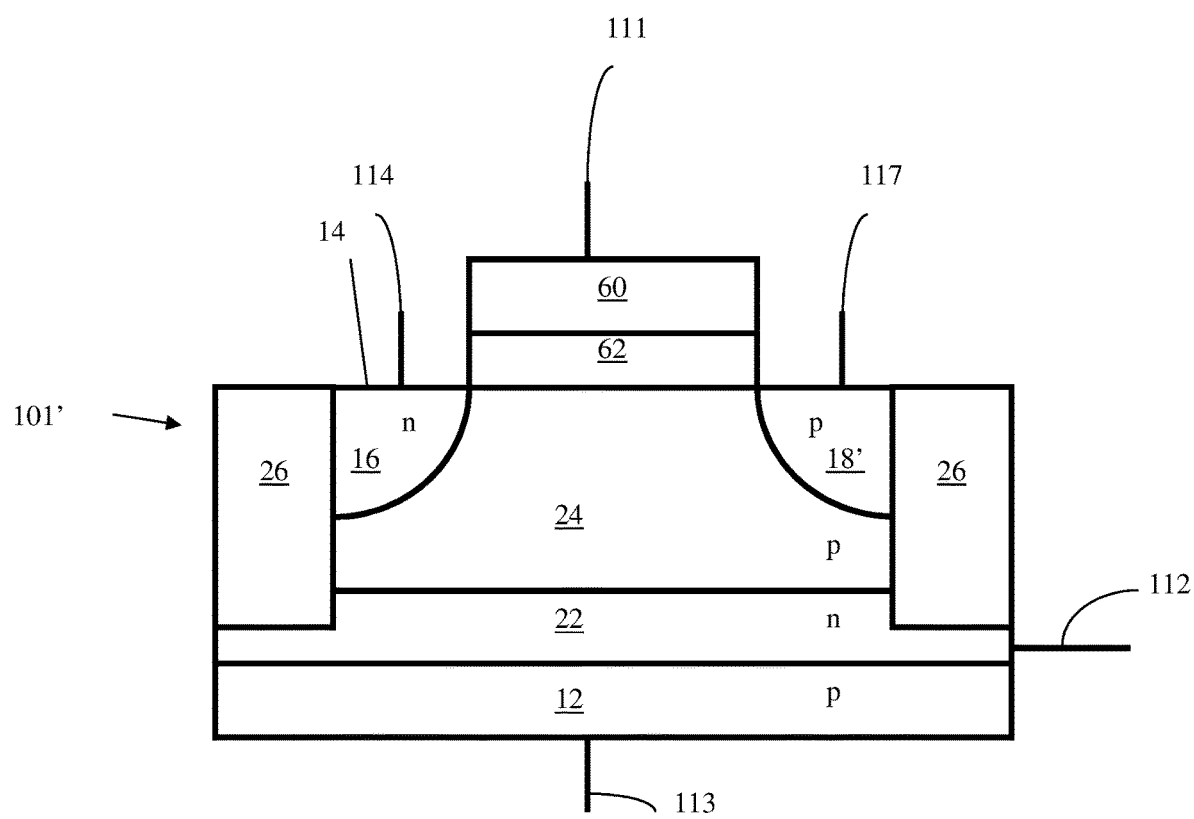
FIG. 1B is a cross sectional, schematic illustration of a floating body memory cell with a P+ contact, according to an embodiment of the present invention.

FIG. 1A shows a floating body memory cell 101 that has been described for example in Widjaja-1 and Widjaja-2. The cell 101 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and is exposed at surface 14. A second region 18 having the second conductivity type is also provided in substrate 12, and is also exposed at surface 14. Second region 18 is spaced apart from the first region 16, as shown. First region 16 and second region 18 may be formed by an implantation process on the material making up substrate 12, according to any of implantation processes known and typically used in the art. Alternatively, a solid state diffusion process may be used to form first region 16 and second region 18.

A buried layer 22 of the second conductivity type is also provided in the substrate 12, buried in the substrate 12, as shown. Buried layer 22 may also be formed by an ion implantation process on the material of substrate 12. Alternatively, buried layer 22 can be grown epitaxially. A floating body region 24 of the substrate 12 having a first conductivity type, such as a p-type conductivity type, is bounded by surface, first and second regions 16,18, insulating layers 26 and buried layer 22. Insulating layers 26 (e.g., shallow trench isolation (STI)), may be made of silicon oxide, for example. Insulating layers 26 insulate cell 101 from neighboring cells 101 when multiple cells 101 are joined in an array. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

In another embodiment, the memory cell 101 may be provided with p-type conductivity type as the first conductivity type and n-type conductivity type as the second conductivity type.

Operation of floating body memory cell (FBMC) 101 of FIG. 1A is described, for example in U.S. Pat. No. 8,174,886 to Widjaja et al., which is hereby incorporated herein, in its entirety, by reference thereto. As described by Widjaja et al. U.S. Pat. No. 8,174,886, the FBMC 101 has two distinct stable states which are referred to as state "1" and state "0" throughout this disclosure. State "1" is defined as a stable state where the floating body 24 voltage is at a high voltage such as 0.6V. State "0" is defined as a stable state where the floating body 24 voltage is a low voltage of about 0V, for example between about 0V and 0.1V. A FBMC 101 that is set to be in state "1" will have a high potential at the floating body 24 which in turn will also lower the FBMC threshold voltage better known as Vt. By lowering the Vt of the FBMC 101, the high floating body 24 voltage makes the FBMC 101 easier to conduct by requiring less voltage on the gate 60 to induce conduction between source 16 and drain 18. Alternatively, an FBMC 101 that is set to be in state "0" will have a floating body 24 voltage close to 0V. This state "0" FBMC will have a higher Vt than the State "1" FBMC 101 and thus require a higher bias on the gate 60 in order to turn on this FBMC 101 and allow conduction between source 16 and drain 18 of the FBMC 101.

The FBMC 101' shown in FIG. 1B has both an N+ region 16 and P+ region 18'. Writing is performed on this device 101' through the N+ region 16/terminal 114. Reading can be performed on either the N+ region 16/terminal 114 or the P+ region 18'/terminal 117. The P+ region 18' via terminal 117 is able to readily access the state of the floating body 24, e.g., about 0V or 0.1V for State 0 and about 0.6V for State 1. However care must be taken when accessing through the P+ region 18' since it is a direct connection to the floating body 24 and can easily disturb the state of the memory cell 101'. Alternatively, the floating body region 24 could be n-type, region 18' could be N+ and region 16 could be P+.

In FIG. 1 device 102 is used to sense the contents of memory cell 101, 101'. Since the P+ region 18' of device 101' is connected to the gate 104 of device 102, the content of FBMC 101' (i.e., State 1 or State 0) is protected. When the state of device 101' is at State 0, transistor 102 will be off. When the state of device 101' is at State 1, the transistor 102 will be turned on. This makes reading straightforward as device 102 will attempt to pass ground any time FBMC 101' is set to State 1 and device 102 will be off whenever FBMC 101' is set to state 0. Prior to reading the content of device 101', read bit line 115 can be pre-charged or set to a high voltage such as 1.8V. To read the contents of the FBMC 101', the read access transistor 103 can be turned on by applying a high voltage to the read word line 110. If the FBMC 101' is set to State 1, sense device 102 will turn on and discharge the contents of the read bit line 115 through the read access transistor 103. Alternatively other schemes can be used to sense this memory cell 101' such as voltage sensing and current sensing of read bit line 115 and the examples provided above are meant for exemplary purposes only.

To write to the FBMC 101, 101' the write bit line 114 and the write word line 111 are used. Multiple techniques can be utilized to implement a write 1 or write 0 operations such as Gate Induced Drain Leakage (GIDL) or Gate coupling. GIDL can be used to move the cell 101, 101' to state 1 by driving the write bit line 114 to a positive voltage such as 1.8V, while moving the write word line 111 to a negative voltage such as −1.8V. These conditions will induce a GIDL condition between the high drain/source voltage and the negative gate voltage. Holes will then be injected into the floating body 24 causing the energy barrier between State 0 and State 1 to be overcome in the FBMC operation. Care must be taken in selecting voltages to avoid disturbing cells 101, 101' along the write word line 111 and the write bit line 114. A write 0 can be implemented by driving write bit line 114 to a slightly negative voltage such as −0.3V and then driving the write word line 111 to a high voltage such as 0.6V. The positive voltage on the write word line 111 will cause the floating body 24 to couple high through the gate 60 of device 101, 101'. As the voltage of the FB 24 of cell 101, 101' goes higher, holes are then evacuated due to the forward biased PN junction.

The above method has a drawback of requiring two distinctly separate operations to implement a write 0 and a write 1 and thus require a two-step write operation. Alternatively floating body 24 coupling may be used to write both a state 1 and a state 0 which would avoid the need for a two-step write process. To implement this alternative, write word line 111 is taken from low to high (e.g., about 0V to about 1.8V) during the write operation. The write bit line 114 is used to select which state will be written to FBMC 101, 101'. Write bit line 114 is taken high to a voltage such as 1.8V in order to move the FBMC 101, 101' to State 1. A high voltage on the write bit line 114 causes electrical isolation of the floating body 24 of FBMC 101, 101'. Thus when the write word line 111 moves from 0V to 1.8V, the floating body 24 couples up with the gate 60 causing a transition from State 0 to State 1. Alternatively to write a state 0, the write bit line 114 can be held at a slightly negative voltage such as −0.3V. When the write word line 111 transitions from 0V to 1.8V, the floating body 24 will attempt to couple with the write word line 111. However, due to the negative voltage on write bit line 114, the PN junction between the floating body 24 and the write bit line 114 will forward bias and evacuate holes from the floating body 24. In addition as the write word line 111 transitions from 0V to 1.8V, a channel will develop as the FBMC 101, 101' turns on. Once the channel develops it will pass the bit line 114 voltage from source to drain. Since the write bit line 114 is being held at a slightly negative voltage, this acts as a shield reducing the coupling ratio between the gate 60 of cell 101, 101' to the floating body 24 of cell 101, 101'.

Due to the completely independent nature of the read and write access, the embodiment in FIG. 1 can also be used as a dual port memory. Read and write paths for this memory cell are completely decoupled, so this embodiment can support write operations completely independently of read operations or even implement write and read operations simultaneously.

Figure 2:
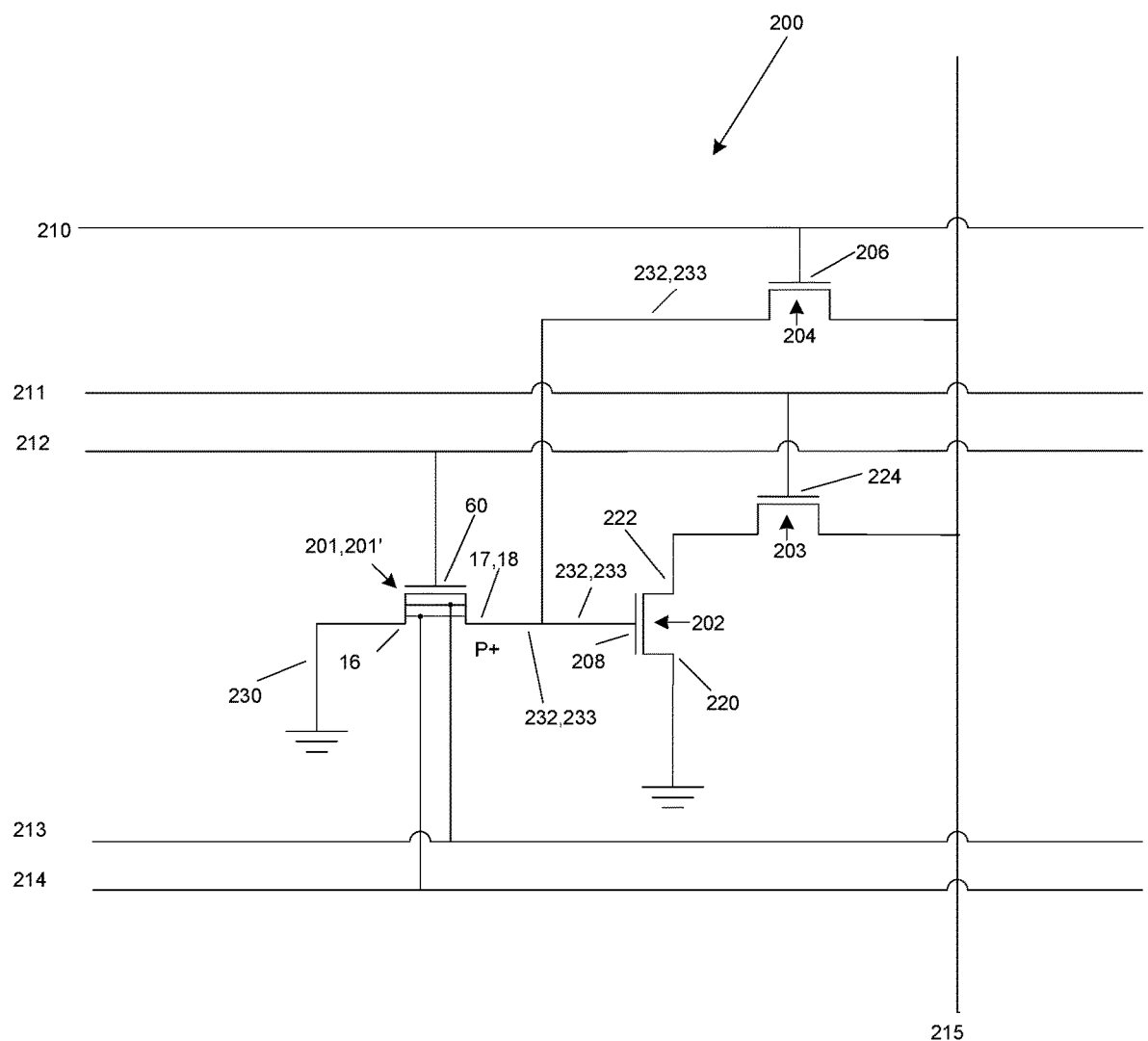
FIG. 2 is a schematic of a four transistor scalable floating body SRAM cell according to an embodiment of the present invention.
Figure 2A:
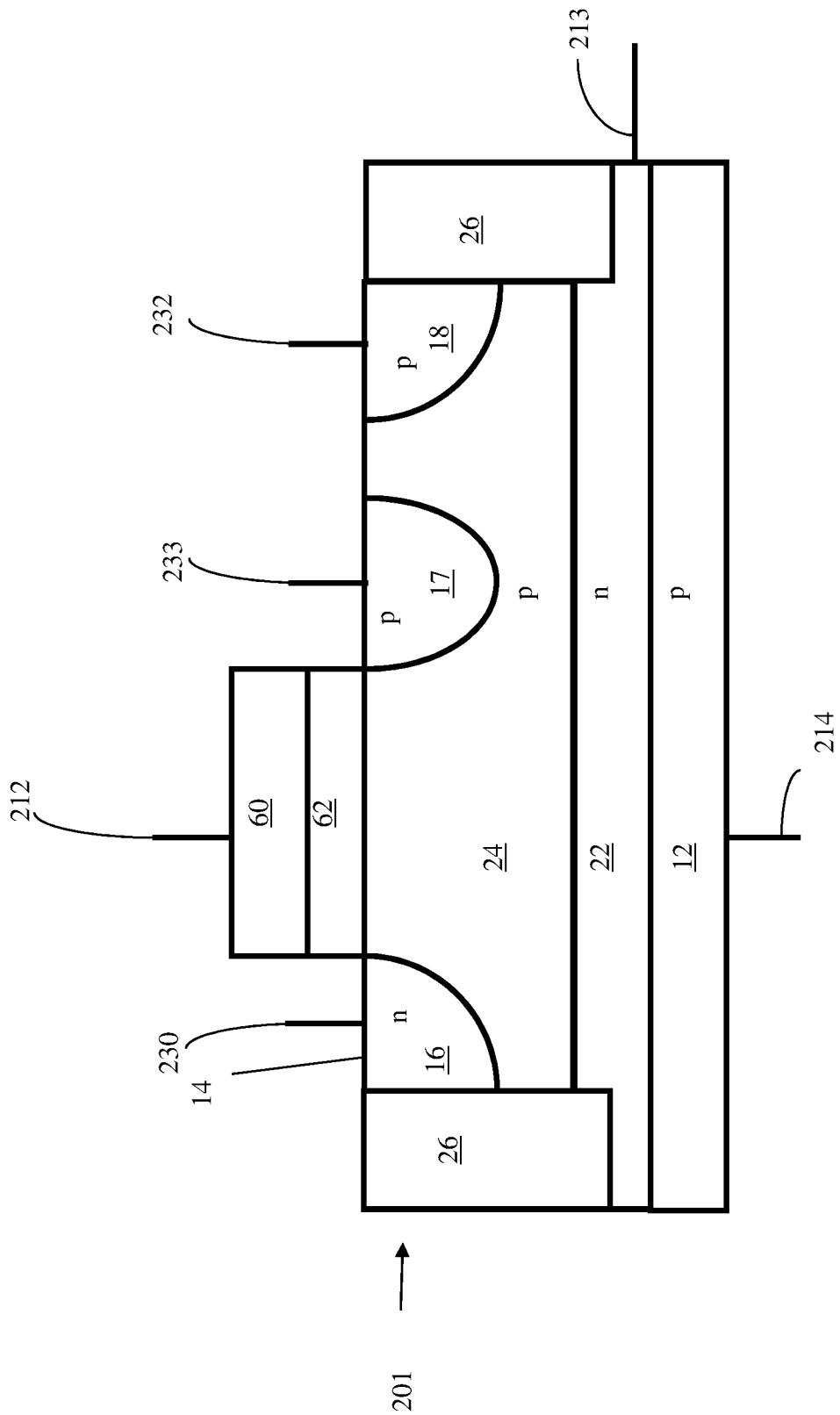
FIG. 2A is a cross sectional, schematic illustration of a floating body memory cell with two P+ contacts, according to an embodiment of the present invention.
Figure 2B:
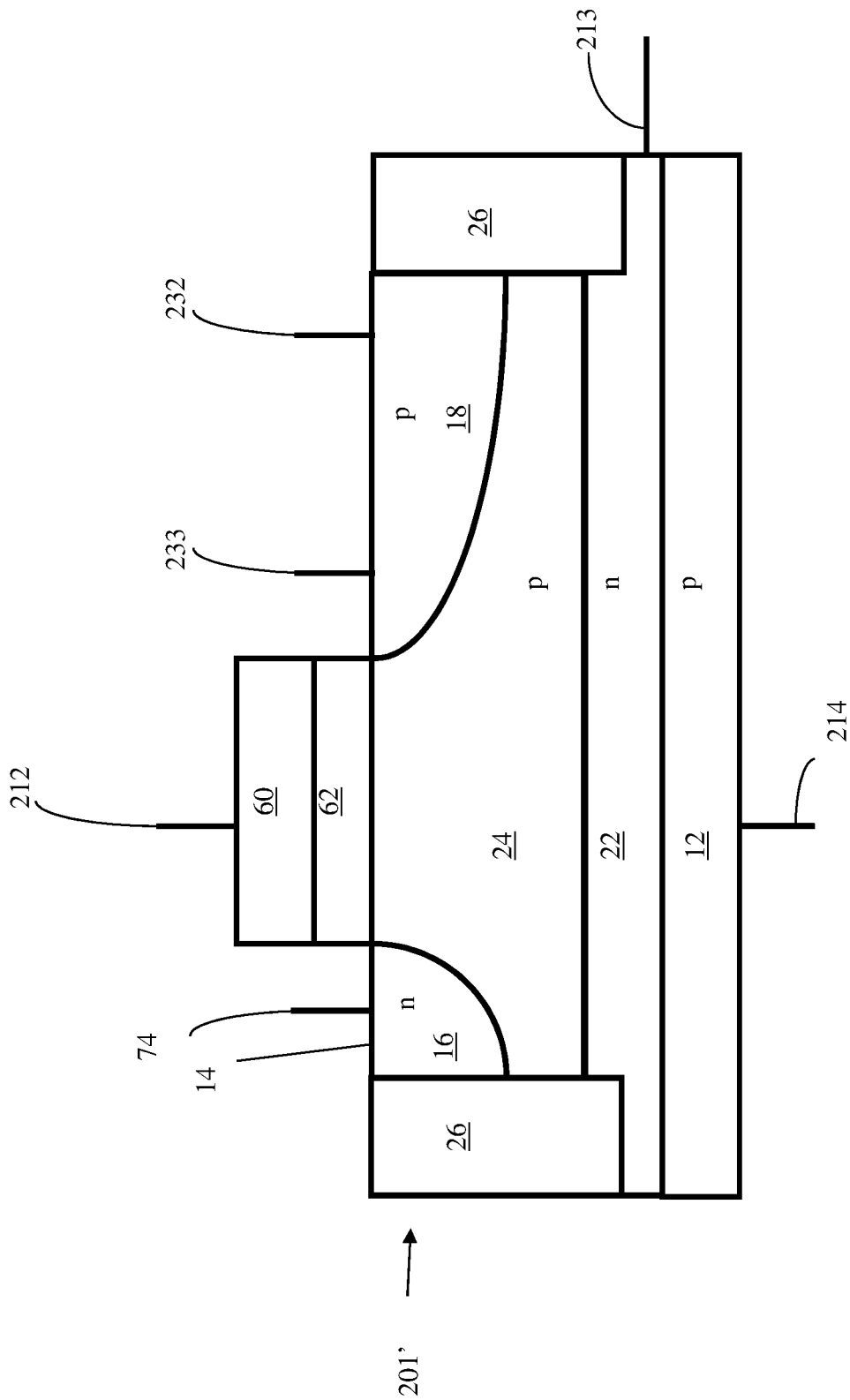
FIG. 2B is a cross sectional, schematic illustration of a floating body memory cell with a P+ contact that has multiple nodes connected to it, according to an embodiment of the present invention.

FIG. 2 is a schematic of a multi-transistor, scalable floating body SRAM cell 200, according to another embodiment of the present invention which can be used in a compiler. This embodiment employs a scalable FBMC 201 or 201', such as shown in FIG. 2A or FIG. 2B, respectively. In this embodiment, ground is applied via line 230 to the source 16 of the FBMC 201, 201'. The P+ terminal 18 of FBMC 201, see FIG. 2B (or 18 and 17 of FBMC 201', see FIG. 2A) is/are connected via terminals 232 and 233 to two devices, a write access transistor 204 and a read sense device 202. In FIG. 2A, terminal 233 connects to terminal 17 and terminal 232 connects to terminal 18. In FIG. 2B, both terminals 233 and 232 connect to terminal 18. In FIG. 2, the gate 208 of read sense device 202 is shorted, with the drain/source of write access transistor 204 via terminals 232 and 233 so that only a single contact and p+ region are required at terminal 18. FIG. 2 is meant to schematically represent all three of these different possibilities. The write access transistor 204 has drain/source connections between the FBMC P+ region/terminal 18 and the bit line 215. The gate 206 of write access transistor 204 is connected to the write word line 210. The read sense device 202 has its gate 208 connected to the FBMC 201 P+ terminal 18. The source 220 of read sense device 202 is connected to ground while the drain 222 is connected to the read access transistor (which may be an NMOS) 203. The read access transistor 203 has its gate 224 connected to the read word line 211. The source/drain connections are connected between the drain 222 of device 202 and the bit line 215. Terminal 213 is connected to the DNWell or buried layer 22 of cell 201, 201' which can be connected to a high voltage source to ensure proper bistable operation of the FBMC 201, 201'. Terminal 214 is the substrate connection, connected to substrate 12 and connected to ground.

Operation of the embodiment of FIG. 2 may be performed using pure logic levels on the bit line 215 in combination with the usage of the read and write word lines 211, 210. The read operation is performed in the same manner as in the embodiment described with regard to FIG. 1. Bit line 215 may be pre-charged to a high voltage such as 1.8V and device 202 can be used to sense the state of the FBMC 201, 201' through read access transistor 203 once read word line 211 has been driven high. Those skilled in the art will appreciate that the sensing example above is meant for exemplary purposes only and that many other sensing schemes may also be employed including but not limited to current sensing and voltage sensing of bit line 215.

The write access transistor 204 is used to write to the FBMC 201, 201'. The desired state voltage is driven to the bit line 215. A low voltage such as 0V may be used to set the FBMC 201, 201' to State 0, while a high voltage such as 1.8V may be used to set the FBMC 201, 201' to State 1. To write to the FBMC 201, 201', the write access transistor 204 is turned on by driving the write word line 210 from low to high. This passes the contents of the bit line 215 to the P+ terminal 18 of the FBMC 201, 201'. This has the effect of directly forcing the floating body 24 of the FBMC 201, 201' to either a high or low state. After the FBMC 201, 201' has been written to, the write access transistor 204 may be turned off by transitioning the write word line 210 from high to low.

The ground voltage on the source 16 of the FBMC 201, 201' biases the FBMC 201, 201' to ensure the bistable nature of the FBMC 201, 201'. Note that the gate 60 of the FBMC 201, 201' is not required for the read and write operation of this memory cell 201, 201' and can be held at a voltage such as ground via line 212. However, it is also possible to use the gate 60 of the FBMC 201, 201' to assist with read and write operations by allowing for some additional coupling during read and write operations. During a read operation it is possible to slightly boost the floating body 24 voltage to improve the conductivity of sense device 202. During a write operation the gate 60 voltage coupling could be used to help improve the efficiency and speed of the write operation.

Alternate memory cell structures 201 and 201' as shown respectively in FIG. 2A and FIG. 2B may be employed and used in the embodiment of FIG. 2 as described above. Lines 232 and 233 are independent connections to the write access transistor 206 and read access transistor gate 208. These lines may be connected to independent P+ regions as shown in FIG. 2A (P+ region 17 and P+ region 18) or connected to the same P+ region (P+ region 18) as shown in FIG. 2B. Independent nodes 232 and 233 as shown in FIG. 2A allow for simultaneous read and write access to the cells 201 and 201'. It is also possible to short the source/drain terminal of device 204 to the gate 208 of device 204 prior to connecting to the FB device 201. In this case only a single P+ region would be required as shown in FIGS. 2 and 1B.

Figure 3:
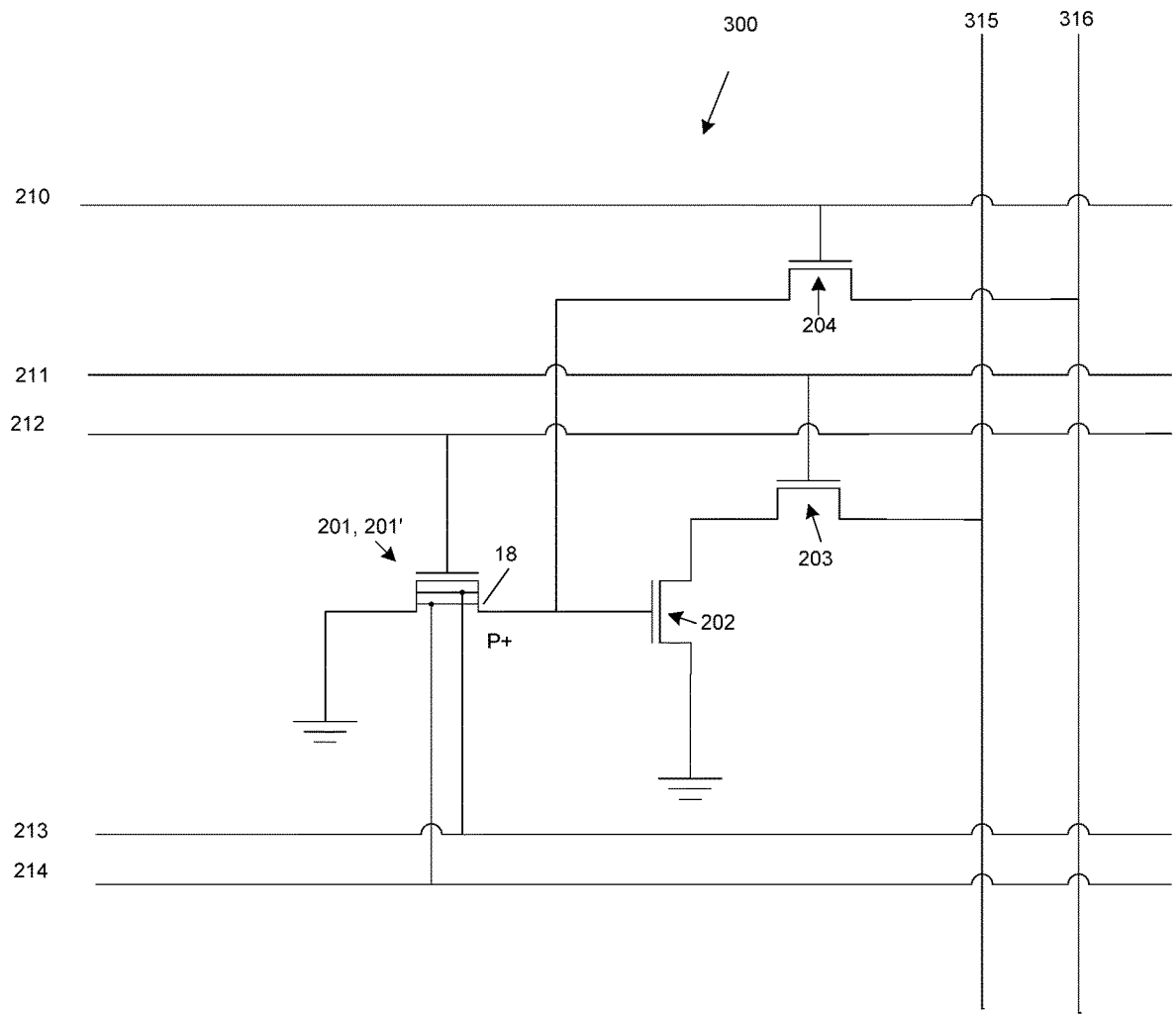
FIG. 3 is a schematic of a four transistor scalable floating body SRAM cell that includes separate bit lines for read and write, according to an embodiment of the present invention.

FIG. 3 is a schematic of a scalable floating body SRAM cell according to another embodiment of the present invention which can be used in a compiler. This embodiment is similar to the embodiment of FIG. 2 but is different in that it includes a write bit line 316 that is separate from and independently operable of read bit line 315. The read bit line 315 is connected to the read access transistor 203 and the write bit line 316 is connected to the write access transistor 204. This allows for independent paths for read and write. Because of the independent read and write paths, it is possible to emulate a dual port operation with the limitations that only one write operation and one read operation can be applied to the cell 201, 201' simultaneously. Additional peripheral logic can be applied to implement, cache and arbitrate the ability to perform two simultaneous read or two simultaneous write operations to fully emulate a dual port cell.

Figure 4:
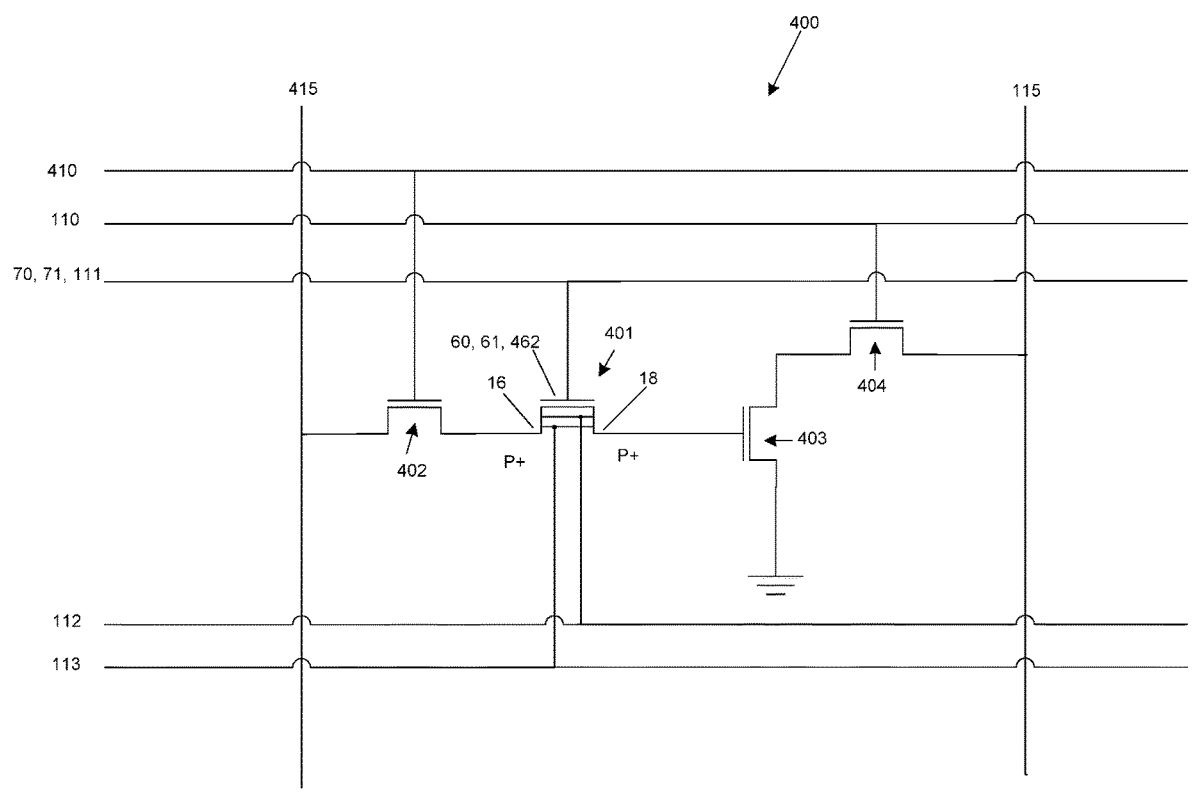
FIG. 4 is a schematic of an alternate embodiment of a four transistor scalable floating body SRAM cell that utilizes a floating body memory cell with two P+ contacts and separate bit lines for read and write, according to an embodiment of the present invention.
Figure 4A:
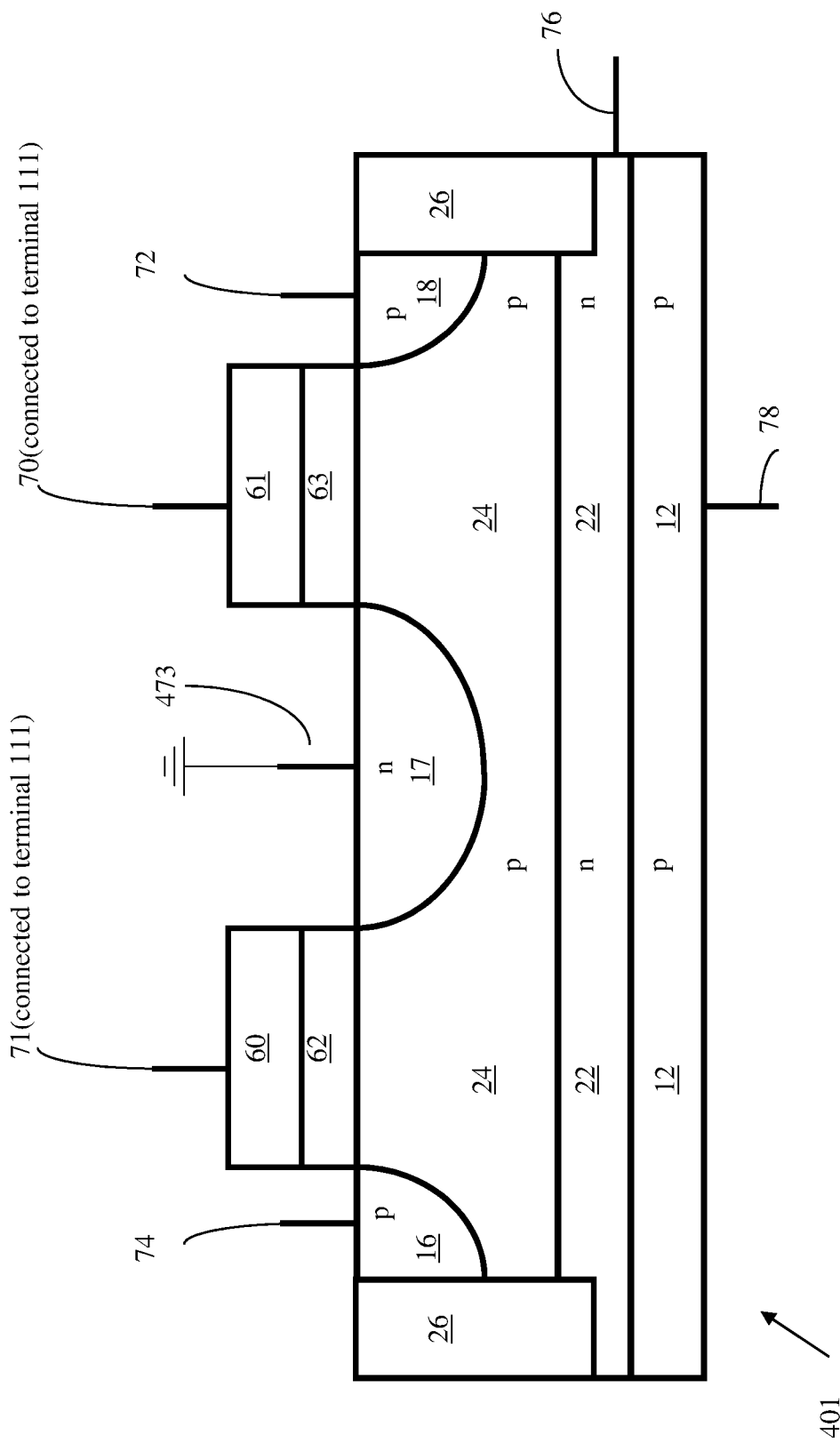
FIG. 4A is a cross section of a dual gate floating body memory cell with two P+ contacts, according to an embodiment of the present invention.

FIG. 4 is a schematic of a multi-transistor, scalable floating body SRAM cell 400, according to another embodiment of the present invention, which can be used in a compiler. This embodiment combines the structure of FIG. 1 but uses the full logic level voltages to read and write the cell contents. The memory cell 401 used in FIG. 4 includes two P+ contacts 16 and 18, respectively. An exemplary schematic, cross-sectional view of how this cell 401 may appear is provided in FIG. 4A. An N+ region 417 is connected to ground 473, as shown in FIG. 4A but not shown in FIG. 4. Additionally FIG. 4A indicates a dual gate structure 60 and 61, however for the intents of the embodiment in FIG. 4 we could assume the gate terminals (71 and 70) to be shorted together, although this is not necessary. A representation of the terminals 70 and 71 shorted together is shown in FIG. 4 as combined gate reference number 462 and terminal 111.

Operation of the embodiment in FIG. 4 uses the same read operation as described in regard to the embodiments of FIGS. 1-3. The write operation using the embodiment of FIG. 4 employs a write bit line 415 in a similar manner to use of the write bit line 114 in the embodiment of FIG. 1. However in the embodiment of FIG. 4 there is a write access transistor 402 connected between the write bit line 415 and the FBMC 401 which has a write select line 410 which must be enabled in order to implement a write operation. Write select line 410 may be shared across multiple cells. The connection between the write access transistor 402 and FBMC 401 is through a P+ connection. Since write access transistor 402 is connected through a P+ connection 16 to the floating body 24, write bit line 415 can be actively driven to the desired state (as determined by voltage level, as described above) by enabling the write access transistor 402 to directly force the floating body 24 to the desired state. For example if the FB of cell 401 is at a low potential (low stable state, i.e., state "0") and it is desired to change the state of FB cell 401 to the high stable state (i.e., state "1), a logic level of Vdd or 1.8V can be applied to the write bit line 415 in conjunction with a high potential such as Vdd to the write access line 415. This would allow for the bit line voltage to directly drive the FB through the write access transistor 402 driving the FBMC to State 1. Once the write select voltage is removed from the write select line 410, write access transistor 402 will turn off, and the FB voltage of device 401 will remain at a high stable state.

The embodiments listed are not limited to a one-transistor (1T) floating body memory cell. Rather, the embodiments described above can also be used in conjunction with other floating body memory cells such as two-transistor (2T) or dual port floating body memory cells, for example, such as described by Widjaja in International Application No. PCT/US13/26466, titled "Memory Cell Comprising First and Second Transistors and Methods of Operating" and U.S. Patent Application Publication No. 2012/0120752, titled "Dual-Port Semiconductor Memory and First-In First-Out (FIFO) Memory Having Electrically Floating Body Transistor", which are both hereby incorporated herein, in their entireties, by reference thereto. Read and write access and sense devices will have to be incremented accordingly to allow for the true dual port access.

Beyond the implementation of scalable floating body memory cells to be used in compilers, specific criteria can be used to properly select the ideal floating body memory technology to be used within a memory design. Speed/performance, density, standby power, port access, memory size, reliability, byte size, page size and erase block size are all examples of criteria which can be used to select the preferred floating body memory cells to be used with a memory array design. Examples of the floating body memory cells available for selection may include, but are not limited to: 1T cell, 2T cell, 3T cell, 4T cell, dual port cell, and pseudo dual port cell (where logic circuitry can be used to separate the read and write operations and thus make a memory cell to appear as a dual port memory cell). Individual criteria alone can be used to select a preferred memory cell to be used within a memory compiler. or a combination of criteria can be used to select the preferred memory cell technology for use in making a floating body memory array. For example, in the above exemplary conditions speed/performance may be used to exclude the use of 1T cells for high speed and high performance cells, since the 1T cells require multiple pass write operations, as data must be read and the cell erased prior to writing new data to a 1T array. Further criteria can be used to further eliminate the options for a preferred floating body memory cell array design. However in the case where high density is the desired selected criteria, then the 1T cell may be immediately identified as the ideal choice.

A desired priority of parameters may also be used to select the optimal floating body memory cell for use in making an array. A ranking system can be used to prioritize the importance of the various parameters by rank. For example, the parameter that is most important for the design would have the highest rank, with the second-most important parameter being second ranked, and so forth.

Another example of a selection criterion can be standby power. Different selections of cell size and configuration may be considered based on the standby power requirements.

An example of how the previously mentioned criteria can be used to select a preferred floating body memory cell for use in an array design is provided hereafter. Speed/performance: 2T, 3T and 4T would be available options. 1T would be ruled out since it is the slowest due to the need for it to erase an entire row/page and then re-write the new data.

Density: 1T cell would be the primary option. Rankings would be based on the smaller cells having priority (e.g. 2T, then 3T, then 4T):

Standby power: 2T or 4T would be preferred since these two cells completely isolate the FBMC to avoid potential leakage paths between cells;

Port access: Options here could be single port, dual port or pseudo dual port. This criterion could actually be used as an option to add to any of the current cells as the use of the dual port FBMC may be considered for all memory cells. Pseudo dual port memory cells could be listed as an option which would prioritize the 3T and 4T cells;

Memory size: Larger arrays would probably lean toward the 1T cell for the high density advantage they provide. An argument can also be given for the 4T cell since it is so robust and can easily scale to large bit line and word line dimensions since it has the simplest reading and writing mechanics;

Reliability: 4T cell may be desirable due to the simplicity of the read and write mechanics;

Erase block size/single bit selectivity: This criterion may be used to rule out the k1T cell choice, since it requires a row/page to be erased before being written. This most likely will require a read prior to writing, then an erase, then a re-writing of data. Bit selectivity would suggest the 2T, 3T or 4T cells since all of those options are bit selectable for write operations.

Figure 5:
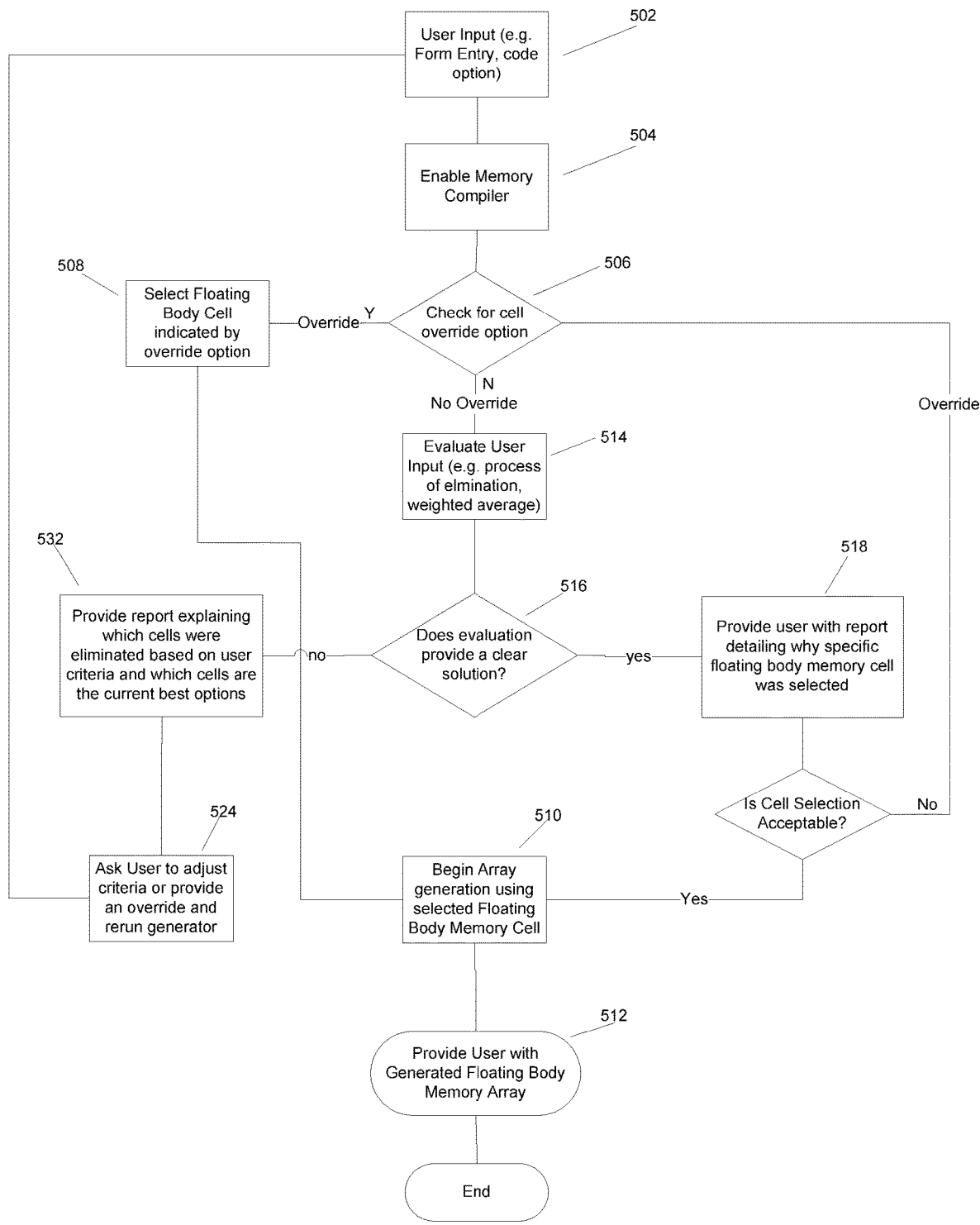
FIG. 5 is a flow chart indicating a generator selection process which can identify which floating body memory cell technology to select for a memory compiler, according to an embodiment of the present invention.

An example of a memory compiler utilizing a selection process for a floating body memory cell is provided in FIG. 5. This flow chart is for exemplary purposes only and is not meant to limit the scope of this invention. To start the process the user at event 502 provides some sort of user input criteria to the compiler. This may occur in many potentially different ways, for example the criteria listed above could be provided as user parameters in the compiler code, another option could be a pop up form which asks the user questions related to the importance of criteria related to the floating body memory cell. The examples above are for exemplary purposes and not meant to limit the methods in which the compiler may obtain user data/preferences. At event 504, the user enables the memory compiler to proceed with the selection process based upon the inputted criteria. An override option can be provided. The override option can be provided through various means such as code entry or form entry. An override can be used to force the compiler to select a specific memory selected by the user, should the user desire this. At event 506 the compiler executes the process to check as to whether an override option has been submitted by the user. If an override option has been inputted, processing goes to event 508, where the floating body memory cell indicated by the override instruction is selected for use in designing and making the array. At event 510, the compiler begins and carries out the generation of the array design using the selected floating body memory cell type (e.g., 1T, 2T, 3T, 4T, dual-port, pseudo dual port, etc.). At event 512 the compiler outputs the floating body memory array having been generated based on the selected floating body memory type, thereby providing the user with the design and physical layout of the floating body memory array, and the process ends at event 514.

Referring back to event 506, if it is determined that an override option has not been submitted by the user, then the compiler evaluates the other user input at event 514 to attempt to determine the best choice of floating body memory cell to select for making the array, based upon the user's inputs. The evaluation process may include processing the input data to find a selected type of floating body memory cell by process of elimination, selecting the cell type that has the greatest number of features selecting those inputted by the user, and/or by other analysis techniques, including, but not limited to average weighting of ranked features for each cell type and then selecting the cell type with the highest weighted average.

At event 516, the compiler determines whether the evaluation process of event 514 has provided a clear solution as to which type of floating body memory cell is to be selected. If the evaluation process did provide a clear solution, then the compiler at event 518 outputs a report to the user which provides the details upon which the selected memory cell type was selected. Optionally, the process may provide the user an opportunity to review the detailed report to determine whether the cell type that has been selected is acceptable. This is indicated by optional event 520 in FIG. 5. If optional event 520 is carried out and the selected cell is acceptable, or if optional event 520 is not included as an option, processing goes to event 510 for array generation as described above.

If optional event 520 is carried out and the cell selection is not acceptable, the user at event 520 can then input a cell override option, and processing returns to event 506, where it is determined that there is a cell override option, and processing goes to event 508, which was described above.

Referring back to event 516, if it is determined that the evaluation process of event 516 did not provide a clear solution, for example when the provided criteria provides multiple potential solutions or possibly even no available solution, then the compiler at event 522 outputs a report to the user that explains which cell type choices were eliminated and upon which user criteria those choices were eliminated. Additionally, the report details which cell types are the best options (those which have not yet been eliminated) and shows the details of the user input that apply to each cell type remaining.

At event 524, the compiler processing prompts the user to adjust the criteria of the original user input or provide an override and rerun the processing. This returns the processing to event 502 where the user adjusts the user input to restart the process.

Thus, if the compiler, upon evaluation of criteria provided by the user, determines a clear solution as to the specific type of floating body memory cell to select for use in making an array, a report is generated explaining why the specific floating body was selected and which criteria influenced the decision.

On the other hand, if there is no clear single solution, a report can be provided to the user explaining why the compiler had trouble selecting a floating body memory cell to use. It can explain which cells were eliminated from the process and which cells were final candidates and what criteria influenced the decision. The user can then either choose to select a specific floating body memory cell to use with the compiler or again adjust the criteria to influence the decision of the generator.

Figure 6:
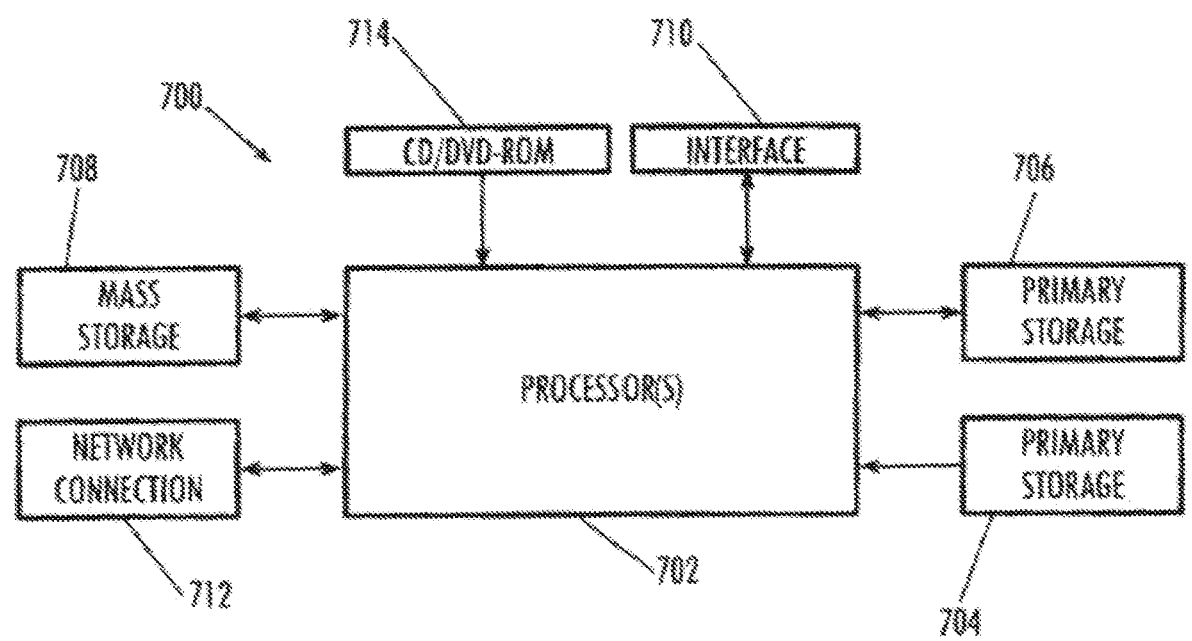
FIG. 6 illustrates a typical computer system, components of which, or all of which may be employed in a memory compiler according to an embodiment of the present invention.

FIG. 6 illustrates a typical computer system, components of which, or all of which may be employed in a compiler according to an embodiment of the present invention. The computer system 700 includes any number of processors 702 (also referred to as central processing units, or CPUs, and, for example, which may be employed in the computer controller of system 100, as well as one or more sub-sections described) that are coupled to storage devices including primary storage 706 (typically a random access memory, or RAM), primary storage 704 (typically a read only memory, or ROM). As is well known in the art, primary storage 704 acts to transfer data and instructions uni-directionally to the CPU and primary storage 706 is used typically to transfer data and instructions in a bi-directional manner Both of these primary storage devices may include any suitable computer-readable media such as those described above. A mass storage device 708 may also be coupled bi-directionally to CPU 702 and provides additional data storage capacity and may include any of the computer-readable media described above. Mass storage device 708 may be used to store programs, data and the like and is typically a secondary storage medium such as a hard disk that is slower than primary storage. It will be appreciated that the information retained within the mass storage device 708, may, in appropriate cases, be incorporated in standard fashion as part of primary storage 706 as virtual memory. A specific mass storage device such as a CD-ROM or DVD-ROM 714 may also pass data uni-directionally to the CPU.

CPU 702 is also coupled to an interface 710 that includes one or more input/output devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers, any of which may be provided to a user of the compiler for providing inputs and receiving outputs in the process described with regard to FIG. 5, for example. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. The above-described devices and materials will be familiar to those of skill in the computer hardware and software arts.

The hardware elements described above may implement the instructions of multiple software modules for performing the operations of this invention. For example, instructions/algorithms for use in selecting an optimum choice of floating body memory cell for use in building a memory array may be stored on mass storage device 708 or 714 and executed on CPU 702 in conjunction with primary memory 706. Likewise, algorithms and instructions for design and building of a memory array, based upon a specific type of floating body memory cell and other user inputs may be stored on mass storage device 708 or 714 and executed on CPU 702 in conjunction with primary memory 706.

The embodiments described above use a P+ tap cell. The present invention provides floating body memory cells that are ideal for memory compiler uses in array design, as they are easily scalable and robust in nature with robust operating conditions. Alternatively, an N+ tap cell can be used for a cell having an n-type floating body region 24. In each case, the tap cell is of the same conductivity type as the floating body region, but is more heavily doped.

The embodiment of FIG. 1 uses a three-transistor, with P+ tap of the floating body device 101' connecting to the gate 104 of pull down device 102. Pull down device 102 is gated with a select device 103. Select device 103 is connected to a read bit line 115.

Read bit line 115 can be pre-charged and then contents can be read depending on if read bit line 115 is pulled down once select transistor 103 is enabled. If the data stored in floating body region 24 is high (i.e., state "1"), the pull down transistor 102 will be turned on. If select gate (device 103) is enabled, bit line 115 will be pulled low.

Region 16 is connected to a write bit line 114. Write operations can be performed to floating body region 24 through the write bit line 114 in conjunction with the gate bias on gate 60. Advantageously with regard to the read path, the output of the read bit line 115 will be either pre-charged voltage or 0V, depending upon the current state of the floating body region 24. Scalability is based on performance here. For larger columns of memory cells, the memory compiler can adjust to either reduce the read speed, or adjust to use a larger cell with a stronger pull down and pass gate.

The embodiment of FIG. 1 can readily be used as a dual port device with separate read and write paths.

The embodiment of FIG. 2 is a four-transistor cell. Region 16 of floating body device 201, 201' is grounded. Region 18 has two devices 201, 204 connected to it. Two devices 202 and 203 are identical to the read structure 102, 103 in the embodiment of FIG. 1. The added device (such as NMOS) 204 is a write device which connects bit line 215 directly to the P+ tap of device 201, 201'. Advantageously, pure logic levels can be used to read and write this cell, and this helps reduce or avoid the need for additional required generated voltage or additional circuits such as sense amplifier circuits or the like. A write operation simply overpowers the floating body device 201, 201' once the write access transistor 204 is enabled.

The embodiment of FIG. 3 uses separate bit lines 315, 316 for read and write, respectively. This allows for dual port functionality.

The embodiment of FIG. 4 is same as the embodiment of FIG. 1, except that it uses a two-transistor floating body cell instead of a one transistor floating body cell, with the result being a four transistor cell overall. Thus, there is a select gate provided by device 402 between region 16 and the write bit line 415.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method of selecting a preferred floating body SRAM cell type by a memory compiler for use in array design, wherein the preferred floating body SRAM cell comprises a floating body region configured to be charged to a level indicative of a state of the memory cell, said method comprising:
   a user inputting preferred design criteria to at least one processor of the memory compiler;
   the memory compiler evaluating the preferred design criteria by executing at least one algorithm configured to select the preferred floating body SRAM cell type based on the design criteria inputs received;

determining whether the preferred floating body SRAM cell type can be identified based upon the preferred design criteria inputted and the at least one algorithm executed; and selecting the preferred floating body SRAM cell type when identifiable;

providing the user with an array design requested by the user, wherein the array design employs floating body SRAM cells of the preferred floating body SRAM cell type; and when a preferred floating body SRAM cell type cannot be clearly identified, providing the user with a report identifying floating body SRAM cell types that were eliminated based on the preferred design criteria, providing remaining SRAM cell type choices that were not eliminated and indicating which are preferable for selection; and requesting the user to adjust the preferred design criteria or provide an override so as to manually select the preferred floating body SRAM cell type.

2. The method of claim 1, wherein floating body SRAM cell types from which the preferred floating body SRAM cell type is selected include: one-transistor floating body SRAM cell, two-transistor floating body SRAM cell, three-transistor floating body SRAM cell, four-transistor floating body SRAM cell, dual-port floating body SRAM cell and pseudo dual port floating body SRAM cell.

3. The method of claim 1, wherein the array design is an array design selected from the group consisting of: memory array circuit design, memory array layout, memory array timing model, memory array functional model, memory array timing specifications, and memory array symbol.

4. The method of claim 1, wherein said preferred design criteria include at least one of: speed/performance, density, standby power, port access, memory size, reliability, byte size, page size or erase block size.

5. The method of claim 1, wherein the preferred design criteria consists of a single design criterion.

6. The method of claim 1, wherein the preferred design criteria comprise a combination of a plurality of said preferred design criteria.

7. The method of claim 1, further comprising ranking said design criteria to prioritize importance of said design criteria.

8. The method of claim 1, wherein when the preferred floating body SRAM cell type cannot be clearly identified, said method further comprises:

adjusting the design criteria or providing an override;

when adjusted design criteria are provided, the memory compiler evaluating the adjusted design criteria by executing the at least one algorithm configured to select the preferred floating body SRAM cell type based on the adjusted design criteria inputs received;

determining whether the preferred floating body SRAM cell type can be identified based upon the adjusted design criteria inputted and the at least one algorithm executed;

selecting the preferred floating body SRAM cell type when identifiable; and providing the user with an array design requested by the user, wherein the array design employs floating body SRAM cells of the preferred floating body SRAM cell type;

when the preferred floating body SRAM cell type cannot be clearly identified based on the adjusted design criteria, providing the user with a report identifying floating body SRAM cell types that were eliminated based on the adjusted design criteria, providing remaining SRAM cell type choices that were not eliminated and indicating which are preferable for selection; and requesting the user to further adjust the preferred design criteria or provide an override so as to manually select the preferred floating body SRAM cell type; and when an override is provided, providing the user with an array design requested by the user, wherein the array design employs floating body SRAM cells of the preferred floating body SRAM cell type selected by the override.

9. A method of selecting a floating body SRAM cell type by a memory compiler for use in a memory design, wherein the floating body SRAM cell comprises a floating body region configured to be charged to a level indicative of a state of the memory cell, said method comprising:

a user inputting at least one design criterion to at least one processor of the memory compiler;

the memory compiler evaluating the at least one design criterion by executing at least one algorithm configured to select the preferred floating body SRAM cell type from a plurality of different floating body SRAM cell types based on the at least one design criterion input received;

the memory compiler determining whether the preferred floating body SRAM cell type can be identified from the plurality of different floating body SRAM cell types based upon the at least one design criterion inputted and the at least one algorithm executed; and selecting the preferred floating body SRAM cell type when identifiable;

providing the user with a memory design requested by the user, wherein the memory design employs floating body SRAM cells of the preferred floating body SRAM cell type; and when the preferred floating body SRAM cell type cannot be clearly identified, eliminating at least one of the different floating body SRAM cell types as a candidate for selection and providing the user with a report identifying the at least one floating body SRAM cell type or types that was or were eliminated based on the evaluation using the at least one design criterion, and requesting the user to adjust the at least one design criterion input or provide an override so as to manually select the preferred floating body SRAM cell type as an override-selected preferred floating body SRAM cell type.

10. The method of claim 9, wherein when the preferred floating body SRAM cell type cannot be clearly identified, said method further comprising providing the user with a basis for elimination of each of the at least one floating body SRAM cell type or types that was or were eliminated, wherein said basis identifies at least one of the at least one design criterion upon which each floating body SRAM cell type was eliminated.

11. The method of claim 9, wherein when the preferred floating body SRAM cell type cannot be clearly identified, said method further comprising identifying to the user remaining floating body SRAM cell type choices from floating body SRAM cell types of said plurality of floating body SRAM types that were not eliminated.

12. The method of claim 11, wherein upon said identifying remaining floating body SRAM cell type choices from floating body SRAM cell types of said plurality of floating body SRAM types that were not eliminated, said method further comprising identifying which of said remaining floating body SRAM cell types are best options based upon the at least one inputted design criterion.

13. The method of claim 12, further comprising providing to the user basis for the best options by identifying each of the at least one inputted design criterion that applies to each of the floating body SRAM cell types considered to be the best options.

14. The method of claim 9, wherein the memory design is a memory design selected from one memory design from the group consisting of: memory array circuit design, memory array layout, memory array timing model, memory array functional model, timing specifications, and memory array symbol.

15. The method of claim 9, wherein said floating body SRAM cell types from which the preferred floating body SRAM cell type is selected include: one-transistor floating body SRAM cell, two-transistor floating body SRAM cell, three-transistor floating body SRAM cell, four-transistor floating body SRAM cell, dual-port floating body SRAM cell and pseudo dual port floating body SRAM cell.

16. The method of claim 9, further comprising:
in response to said requesting the user to adjust the at least one design criterion input or provide an override so as to manually select an override-selected preferred floating body SRAM cell type, adjusting the at least one design criterion;
the memory compiler evaluating the adjusted at least one design criterion by executing the at least one algorithm configured to select the preferred floating body SRAM cell type from the remaining floating body SRAM cell type choices from floating body SRAM cell types of said plurality of floating body SRAM types that were not eliminated, based on the adjusted at least one design criterion input received;
the memory compiler determining whether a preferred floating body SRAM cell type can be identified from the remaining floating body SRAM cell types based upon the adjusted at least one design criterion inputted and the at least one algorithm executed; and
selecting the preferred floating body SRAM cell type when identifiable, and outputting a report to the user, said report providing details upon which the preferred floating body SRAM cell type was selected;

providing the user with a memory design requested by the user, wherein the memory design employs floating body SRAM cells of the preferred floating body SRAM cell type; and when the preferred floating body SRAM cell type cannot be clearly identified, eliminating at least one of the different floating body SRAM cell types as a candidate for selection and providing the user with a report identifying the at least one of the different floating body SRAM cell type or types that was or were eliminated based on the evaluation using the at least one design criterion, and requesting the user to adjust the at least one design criterion input or provide an override so as to manually select the preferred floating body SRAM cell type as an override-selected preferred floating body SRAM cell type.

17. The method of claim 9, further comprising:
in response to said requesting the user to adjust the at least one design criterion input or provide an override so as to manually select the override-selected preferred floating body SRAM cell type; adjusting the at least one design criterion, providing an override so as to manually select the override-selected preferred floating body SRAM cell type;
the memory compiler providing the user with a memory design requested by the user, wherein the memory design employs floating body SRAM cells of the override-selected preferred floating body SRAM cell type.

18. The method of claim 9, wherein the design criteria available to the user for said inputting at least design criterion are ranked to prioritize the relative importance of each said design criterion.

19. The method of claim 9, wherein said executing at least one algorithm includes executing an algorithm configured to select the preferred floating body SRAM cell type by process of elimination, selecting the floating body SRAM cell type that has the greatest number of criteria inputted by the user.

20. The method of claim 9, wherein said executing at least one algorithm includes executing an algorithm configured to select the preferred floating body SRAM cell type by average weighting of ranked features for each floating body SRAM cell type and then selecting the floating body SRAM cell type with the highest weighted average.

* * * * *